United States Patent
Zhu et al.

(10) Patent No.: US 8,486,287 B2
(45) Date of Patent: Jul. 16, 2013

(54) METHODS FOR FABRICATION OF POSITIONAL AND COMPOSITIONALLY CONTROLLED NANOSTRUCTURES ON SUBSTRATE

(75) Inventors: Ji Zhu, El Cerrito, CA (US); Jeff Grunes, Aloha, OR (US); Yang-Kyu Choi, Albany, CA (US); Jeffrey Bokor, Oakland, CA (US); Gabor Somorjai, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 950 days.

(21) Appl. No.: 10/599,106

(22) PCT Filed: Oct. 14, 2004

(86) PCT No.: PCT/US2004/034079
§ 371 (c)(1),
(2), (4) Date: Apr. 23, 2007

(87) PCT Pub. No.: WO2005/094231
PCT Pub. Date: Oct. 13, 2005

(65) Prior Publication Data
US 2007/0215960 A1      Sep. 20, 2007

Related U.S. Application Data

(60) Provisional application No. 60/554,540, filed on Mar. 19, 2004.

(51) Int. Cl.
*H01L 21/285* (2006.01)
*H01L 21/302* (2006.01)
*H01L 27/00* (2006.01)

(52) U.S. Cl.
USPC ............ 216/41; 438/689; 438/694; 257/414; 257/E1.17; 257/E21.214; 257/E21.235; 257/E27.001

(58) Field of Classification Search
None
See application file for complete search history.

(56) References Cited

U.S. PATENT DOCUMENTS

| | | | |
|---|---|---|---|
| 4,358,340 A | 11/1982 | Fu | |
| 4,393,127 A * | 7/1983 | Greschner et al. | 430/5 |
| 4,419,809 A | 12/1983 | Riseman et al. | |
| 4,419,810 A | 12/1983 | Riseman | |
| 4,502,914 A * | 3/1985 | Trumpp et al. | 438/424 |
| 5,013,680 A * | 5/1991 | Lowrey et al. | 438/242 |
| 5,139,904 A | 8/1992 | Auda et al. | |
| 5,795,830 A * | 8/1998 | Cronin et al. | 438/696 |
| 6,063,688 A * | 5/2000 | Doyle et al. | 438/424 |
| 6,110,837 A * | 8/2000 | Linliu et al. | 438/723 |
| 6,207,490 B1 * | 3/2001 | Lee | 438/241 |
| 6,362,057 B1 * | 3/2002 | Taylor et al. | 438/286 |

(Continued)

OTHER PUBLICATIONS

Winters, H. F.; Coburn, J. W.; The etching of silicon with XeF2 vapor Applied Physics Letters, vol. 34, Issue 1, id. 70 (1979).*

(Continued)

*Primary Examiner* — Allan Olsen
(74) *Attorney, Agent, or Firm* — Robin C. Chiang; Lawrence Berkeley National Laboratory

(57) ABSTRACT

Fabrication methods disclosed herein provide for a nanoscale structure or a pattern comprising a plurality of nanostructures of specific predetermined position, shape and composition, including nanostructure arrays having large area at high throughput necessary for industrial production. The resultant nanostructure patterns are useful for nanostructure arrays, specifically sensor and catalytic arrays.

31 Claims, 24 Drawing Sheets

U.S. PATENT DOCUMENTS

| | | | |
|---|---|---|---|
| 6,413,802 B1 | 7/2002 | Hu et al. | |
| 6,440,637 B1 | 8/2002 | Choi et al. | |
| 6,468,887 B2 * | 10/2002 | Iwasa et al. | 438/585 |
| 6,583,009 B1 * | 6/2003 | Hui et al. | 438/264 |
| 6,686,245 B1 * | 2/2004 | Mathew et al. | 438/283 |
| 6,764,898 B1 * | 7/2004 | En et al. | 438/240 |
| 6,870,235 B2 | 3/2005 | Abstreiter et al. | |
| 6,894,359 B2 | 5/2005 | Bradley et al. | |
| 7,422,696 B2 * | 9/2008 | Mirkin et al. | 216/2 |
| 7,488,685 B2 * | 2/2009 | Kewley | 438/689 |
| 7,572,572 B2 * | 8/2009 | Wells | 430/311 |
| 7,737,039 B2 * | 6/2010 | Sandhu et al. | 438/696 |
| 7,795,149 B2 * | 9/2010 | Sandhu | 438/694 |
| 7,829,262 B2 * | 11/2010 | Tran | 430/311 |
| 7,842,558 B2 * | 11/2010 | Juengling | 438/135 |
| 2003/0134433 A1 | 7/2003 | Gabriel et al. | |
| 2003/0230234 A1 * | 12/2003 | Nam et al. | 117/97 |
| 2004/0136866 A1 * | 7/2004 | Pontis et al. | 422/57 |
| 2007/0077429 A1 * | 4/2007 | Mirkin et al. | 428/402 |
| 2007/0117396 A1 * | 5/2007 | Wu et al. | 438/710 |
| 2009/0321644 A1 * | 12/2009 | Vogt et al. | 250/338.4 |
| 2011/0006208 A1 * | 1/2011 | Freitag et al. | 250/307 |

OTHER PUBLICATIONS

XeF2 Etching of Silicon Characteristics: dry, isotropic, vapor www-inst.eecs.berkeley.edu/~ee143/fal0/lab/XeF2_tutorial.pdf.*

Brazzle, J.D.; Dokmeci, M.R.; Mastrangelo, C.H.; Modeling and characterization of sacrificial polysilicon etching using vapor-phase xenon difluoride, 17th IEEE International Conference on Micro Electro Mechanical Systems (MEMS), 2004, pp. 737-740.*

Wu, et al., "Germanium Nanowire Growth via Simple Vapor Transport," The American Chemical Society, vol. 12 ( No. 3), p. 605-607, (2000).

Cui, et al., "Diameter-Controlled Synthesis of Single-Crystal Silicon Nanowires," Applied Physics Letters, vol. 78 ( No. 15), p. 2214-2216, (Apr. 9, 2001).

Cui, et al., "Doping and Electrical Transport in Silicon Nanowires," The Journal of Phyical Chemistry B, vol. 104 ( No. 22), p. 5213-5216, (Jun. 8, 2000).

Whang, et al., "Large-Scale Hierarchical Organization of Nanowire Arrays for Integrated Nanosystems," Nano Letters, vol. 3 ( No. 9), p. 1255-1259, (2003).

Huang, et al., "Directed Assembly of One-Dimensional Nanostructures into Functional Networks," Science Magazine, vol. 291, p. 630-633, (Jan. 26, 2001).

Cui, et al., "Functional Nanoscale Electronic Devices Assembled using Silicon Nanowire Building Blocks," Science Magazine, vol. 291, p. 851-853, (Feb. 2, 2001).

Melosh, et al., "Ultrahigh-Density Nanowire Lattices and Circuits," Science Magazine, vol. 300, p. 112-115, (Apr. 4, 2003).

Choi, et al., "Nanoscale CMOS Spacer FinFET for the Terabit Era," IEEE Electron Device Letters, vol. 23 (No. 1), p. 25-27, (Jan. 2002).

Choi, et al., "Spacer FinFET: Nanoscale Double-Gate CMOS Technology for the Terabit Era," Solic-State Electronics, vol. 46, p. 1596-1601, (2002).

Cui, et al., "Nanowire Nanosensors for Highly Sensitive and Selective Detection of Biological and Chemical Species," Science, vol. 293, p. 1289-1292, (Aug. 17, 2001).

Hahm, et al., "Direct Ultrasensitive Electrical Detection of DNA and DNA Sequence Variations using Nanowire Nanosensors," Nano Letters, vol. 4 (No. 1), p. 51-54, (2004).

Duan, et al., "Indium Phosphide Nanowires as Building Blocks for Nanoscale Electronic and Optoelectronic Devices," Nature, vol. 409, p. 66-69, (Jan. 4, 2001.

Sonek, et al., "Ultraviolet Grating Polarizers," Journal of Vacuum Science Technology, vol. 19 ( No. 4), p. 921-923, (Aug. 17, 1981).

Flanders, et al., "Application of ≈ 100 Å Linewidth Structures Fabricated by Shadowing Techniques a)," Journal of Vacuum Science Technology, vol. 19 ( No. 4), p. 892-896, (Nov./Dec. 1981).

Cui et al., "Large Area 50 nm Period Grating by Multiple Nanoimprint Lithography and Spatial Frequency Doubling," Applied Physics Letters, vol. 90, p. 043118-1-043118-3, (Oct. 5, 2006).

Flanders, et al., "Generation of <50 nm Period Gratings Using Edge Defined Techniques," Journal of Vacuum Science & Technology B, vol. 1 ( No. 4), p. 1105-1108, (Aug. 29, 1983).

Johnson, et al., "Generation of Surface Gratings with Periods < 1000 Å," Applied Physics Letters, vol. 38 ( No. 7), p. 532-534, (Jan. 13, 1981).

Yu, et al., "Fabrication of Large Area 100 nm Pitch Grating by Spatial Frequency Doubling and Nanoimprint Lithography for Subwavelength Optical Applications," Journal of Vacuum Technology B, vol. 19 ( No. 6), p. 2816-2819, (Aug. 6, 2001).

* cited by examiner

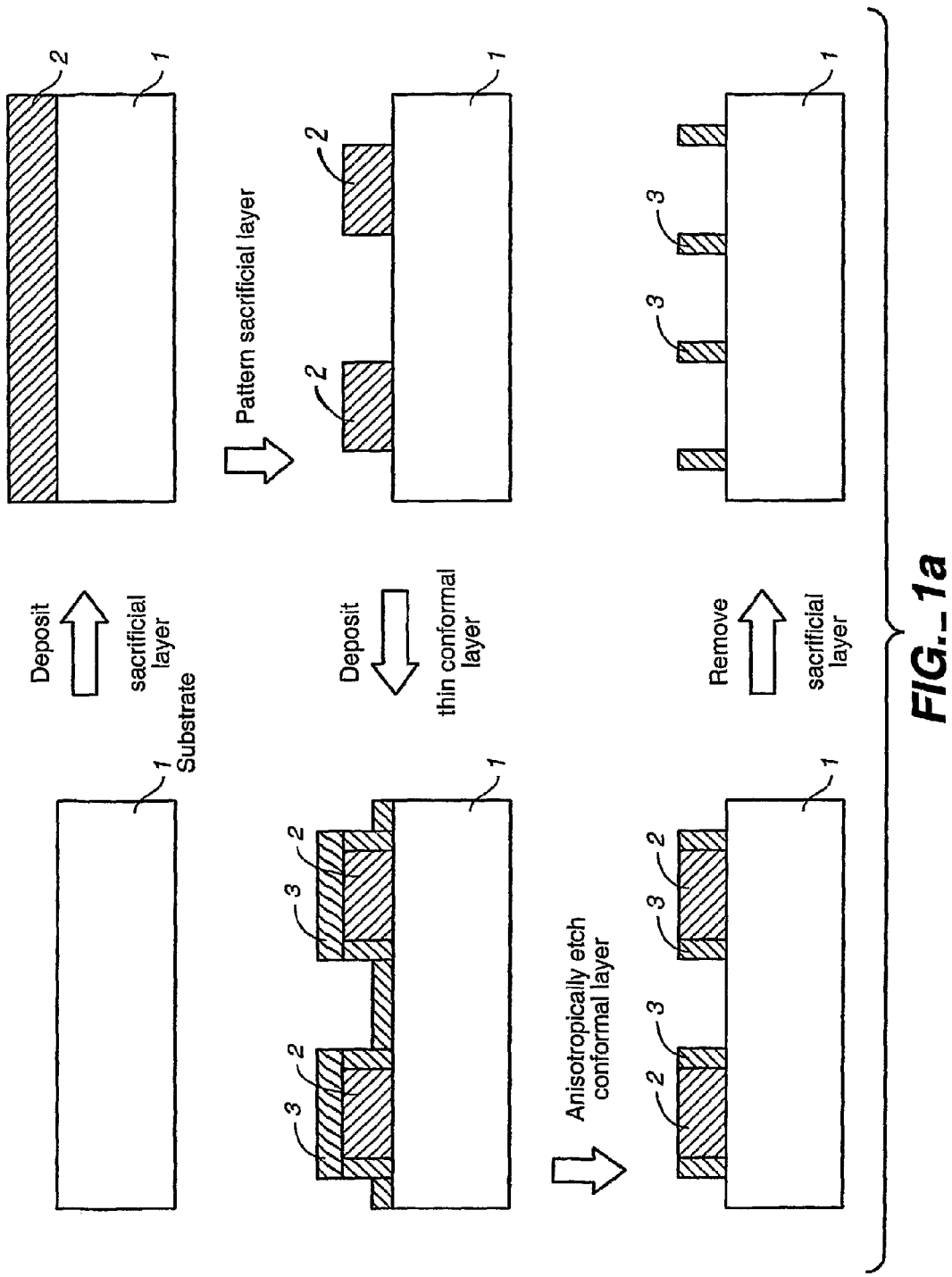
FIG._1a

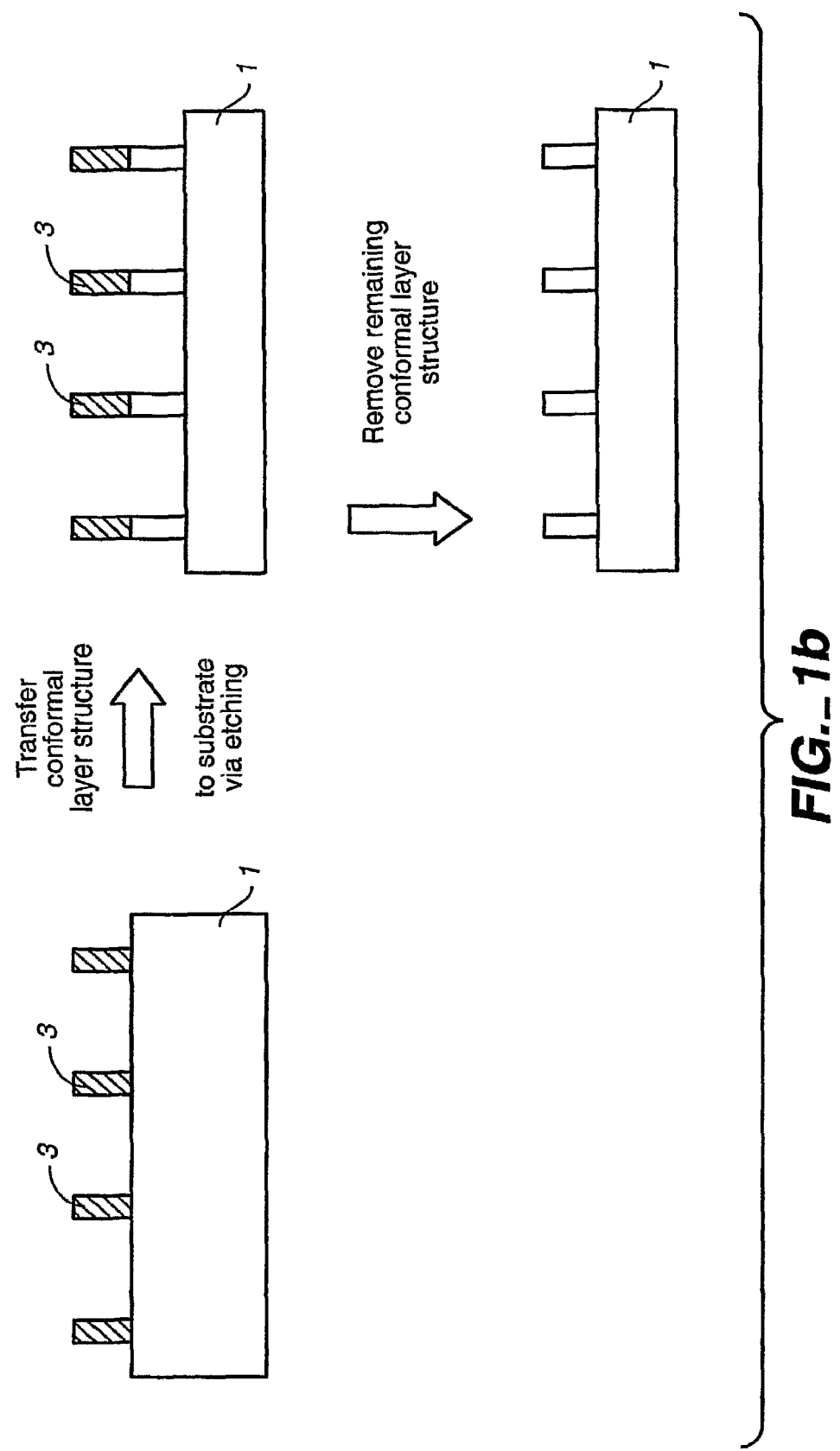
FIG._1b

FIG._2a
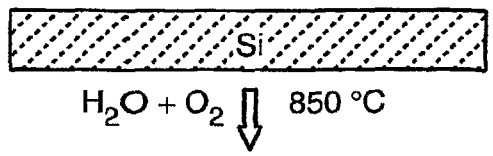
$H_2O + O_2$ ⇩ 850 °C
FIG._2b
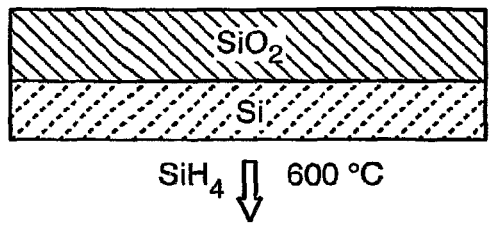
$SiH_4$ ⇩ 600 °C
FIG._2c
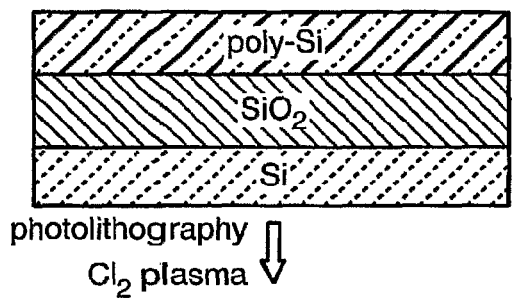
photolithography ⇩
$Cl_2$ plasma
FIG._2d
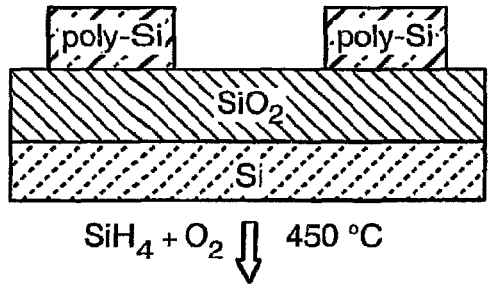
$SiH_4 + O_2$ ⇩ 450 °C
FIG._2e
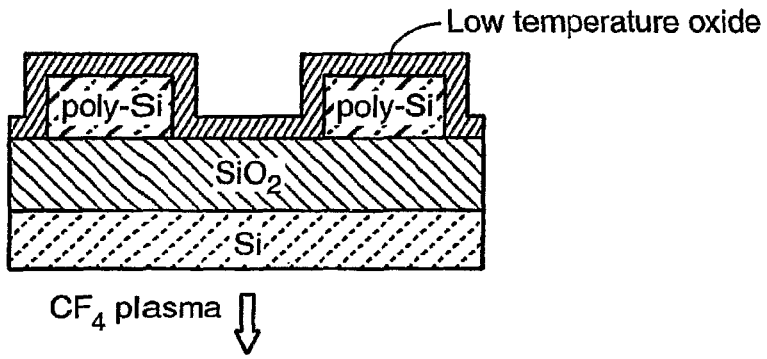
$CF_4$ plasma ⇩

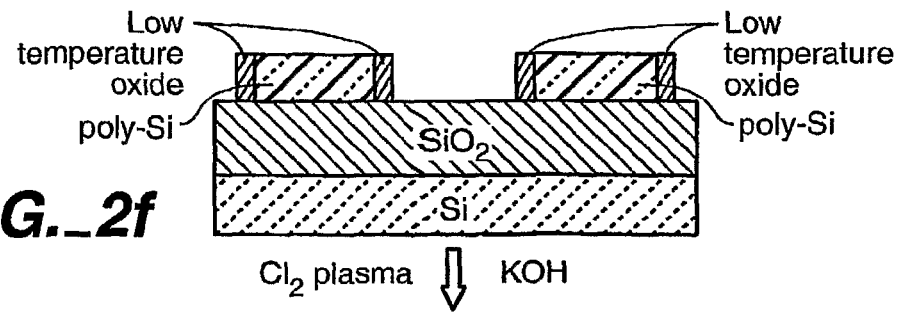
FIG._2f
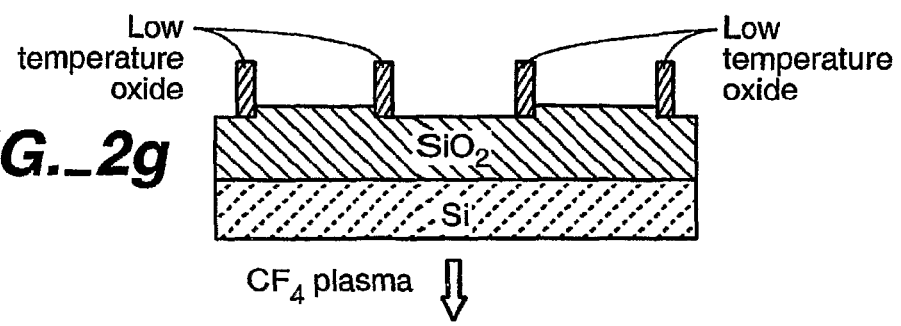
FIG._2g
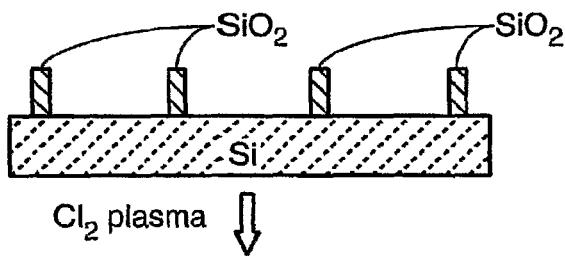
FIG._2h
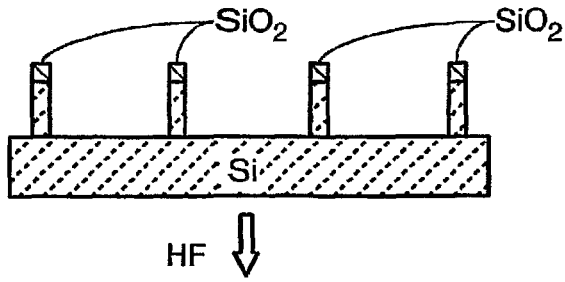
FIG._2i
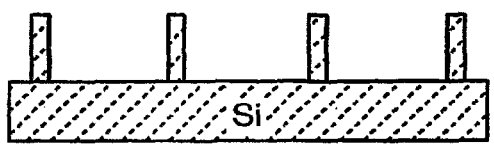
FIG._2j

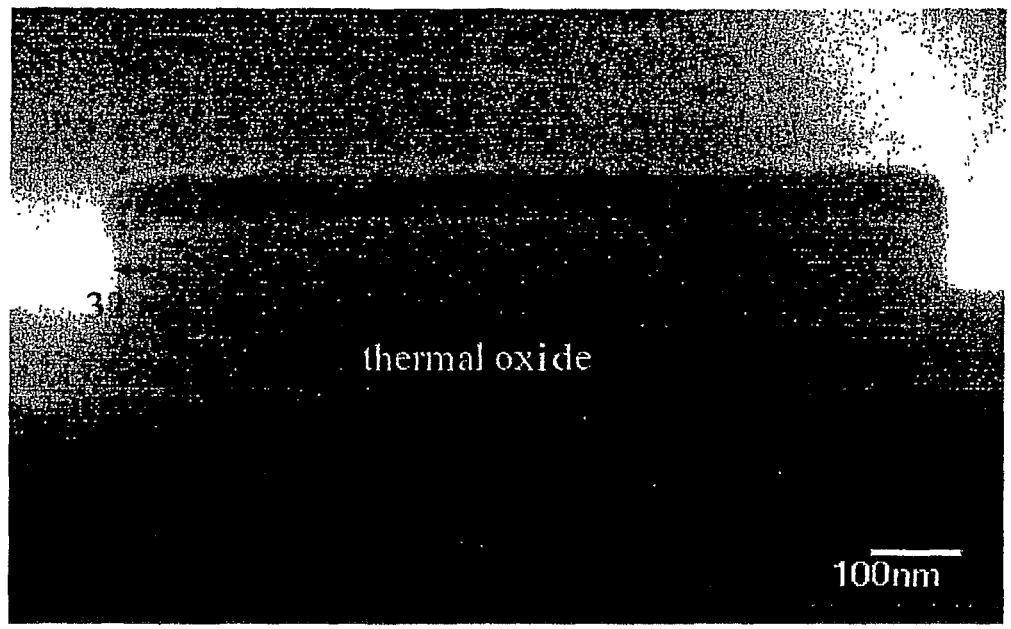
FIG._3a
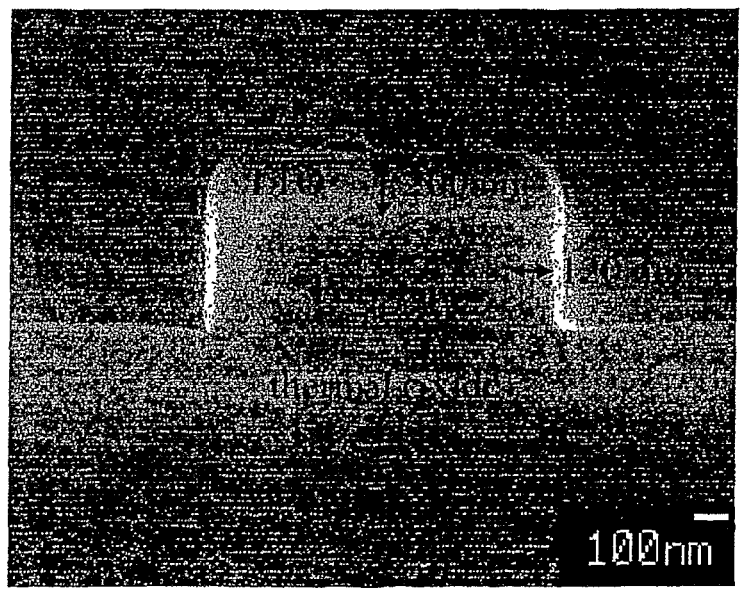
FIG._3b

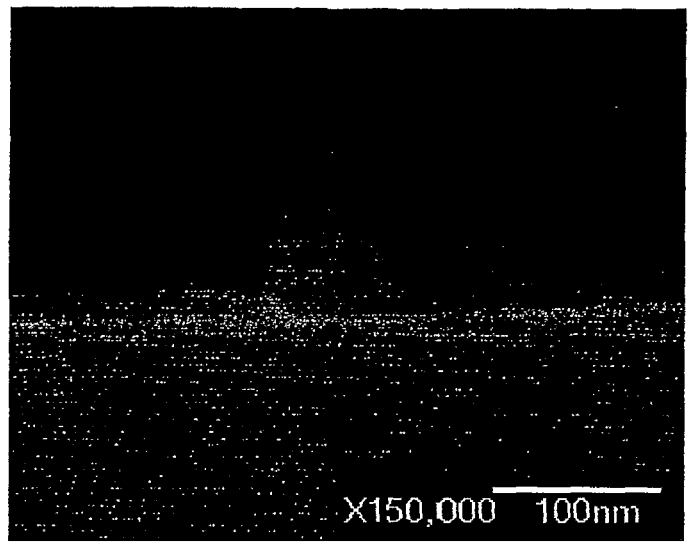
FIG._3c
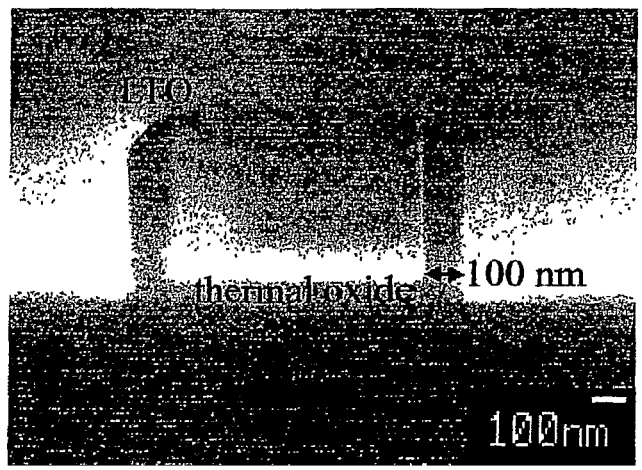
FIG._3d

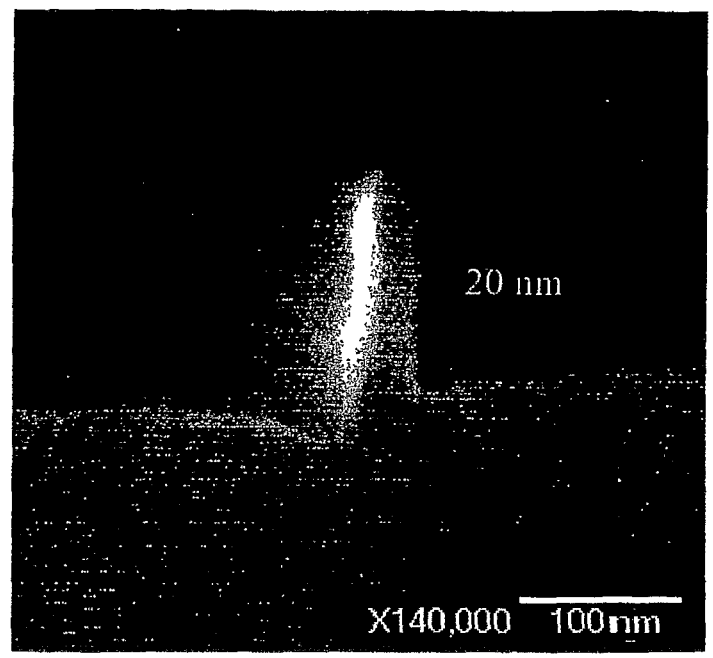
FIG._3e
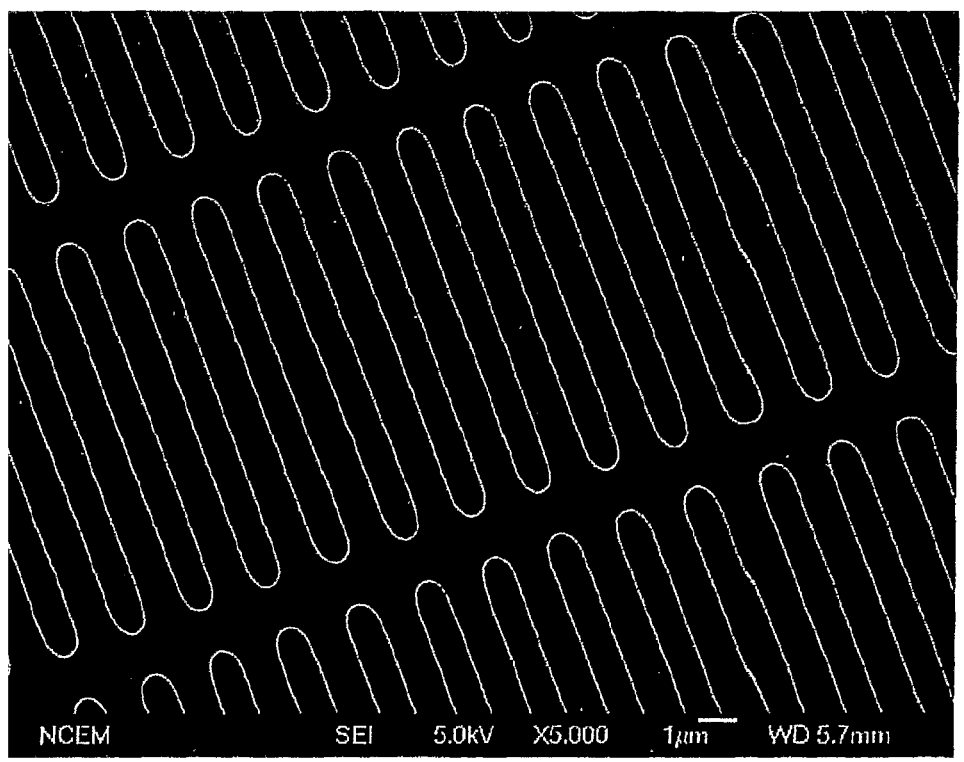
FIG._3f

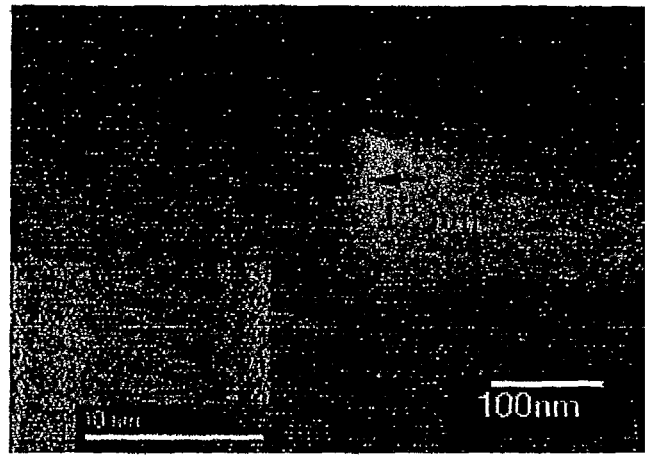
*FIG._4a*
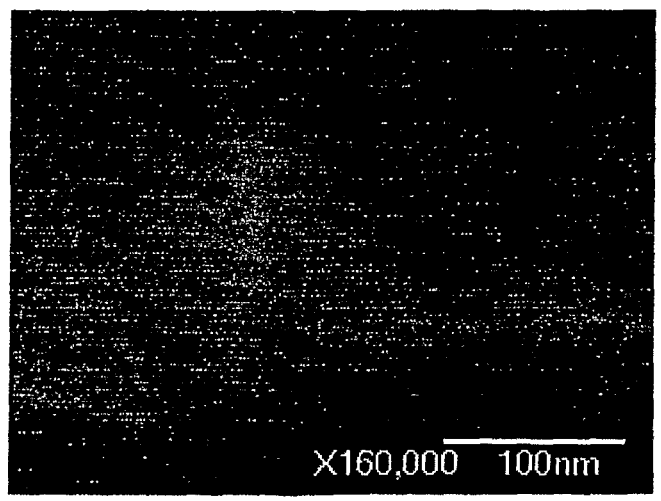
*FIG._4b*

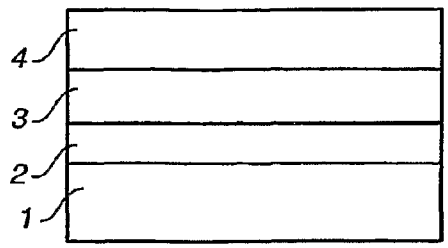
FIG._5a
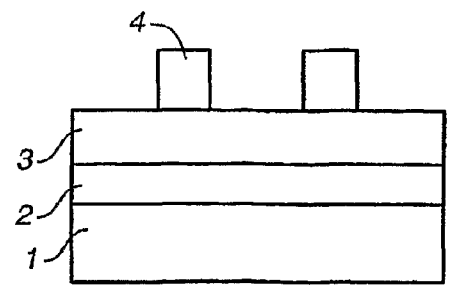
FIG._5b
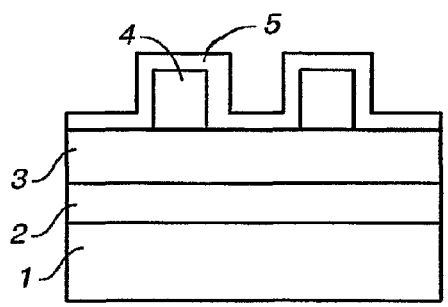
FIG._5c
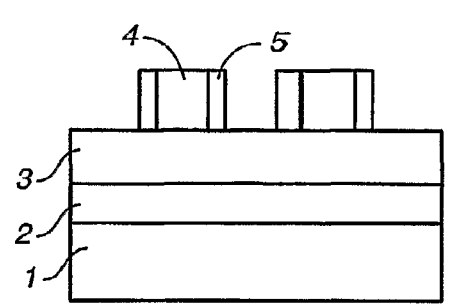
FIG._5d
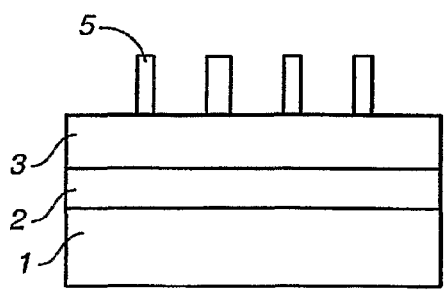
FIG._5e
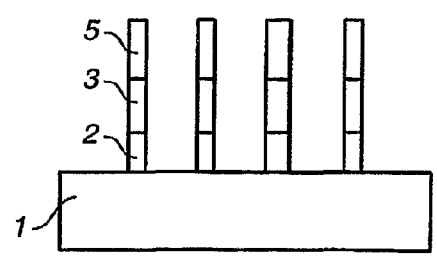
FIG._5f
FIG._5g

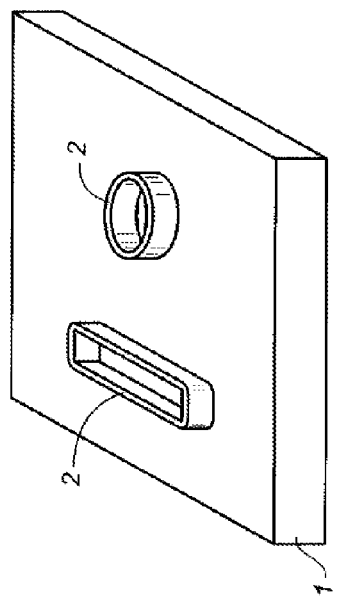
FIG._6b
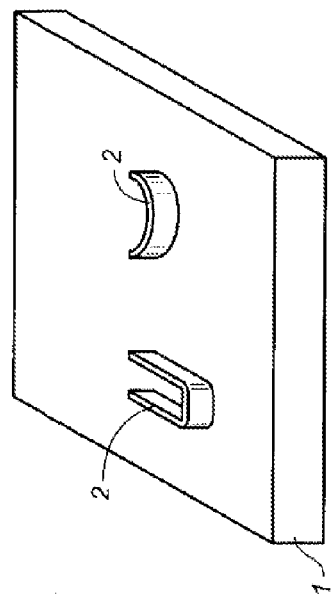
FIG._6d
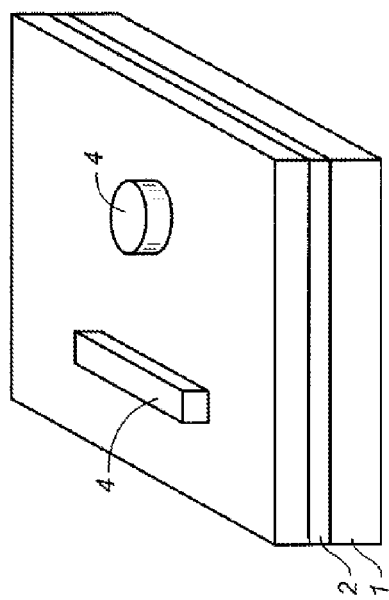
FIG._6a
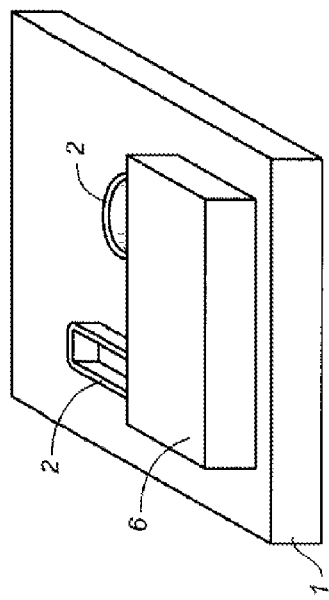
FIG._6c

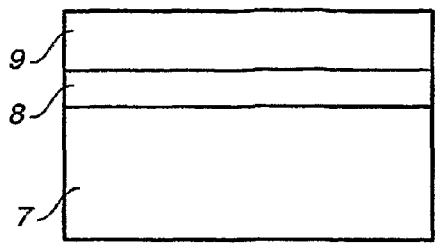
FIG._7a
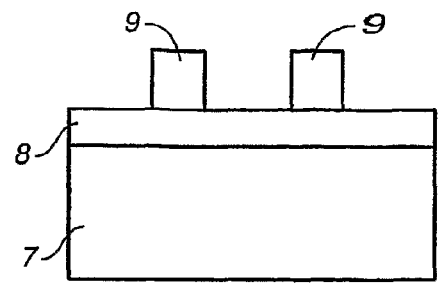
FIG._7b
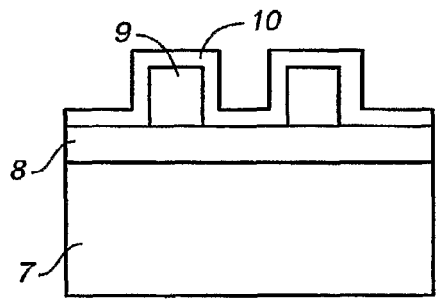
FIG._7c
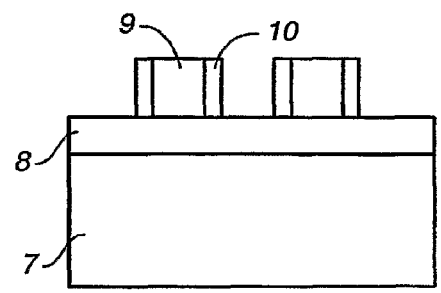
FIG._7d
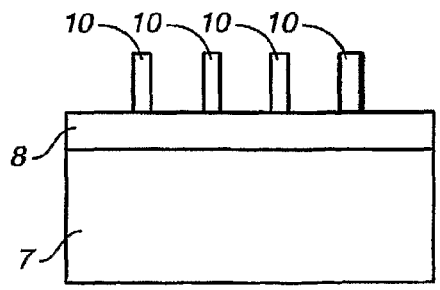
FIG._7e
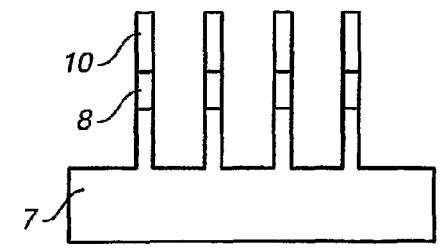
FIG._7f

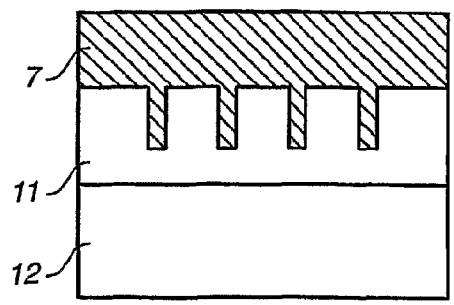
FIG._8a
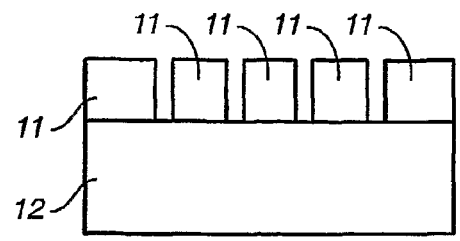
FIG._8b
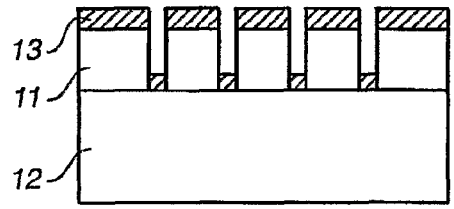
FIG._8c
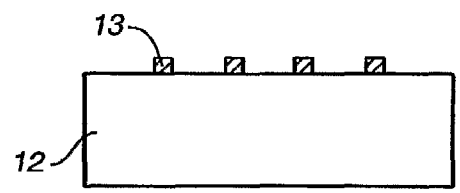
FIG._8d
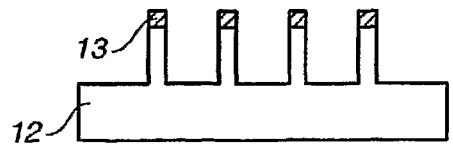
FIG._8e

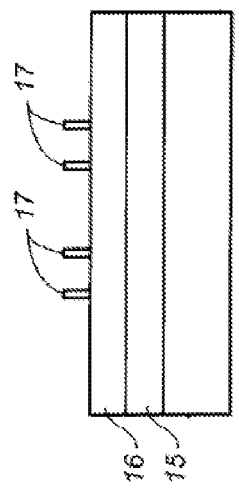
FIG._9b
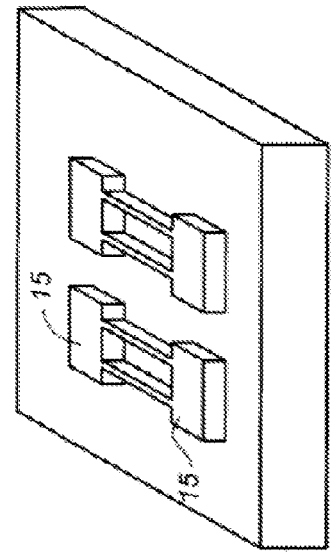
FIG._9d
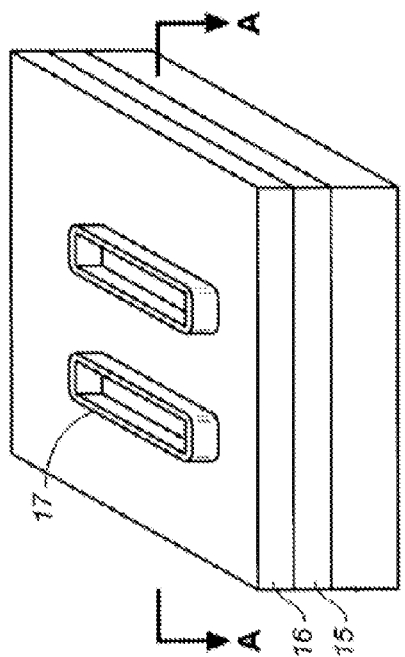
FIG._9a
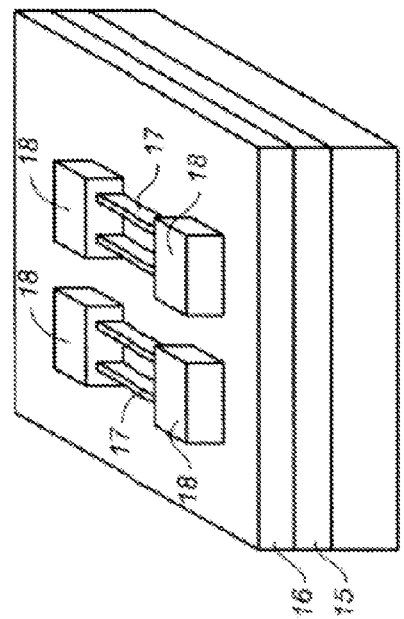
FIG._9c

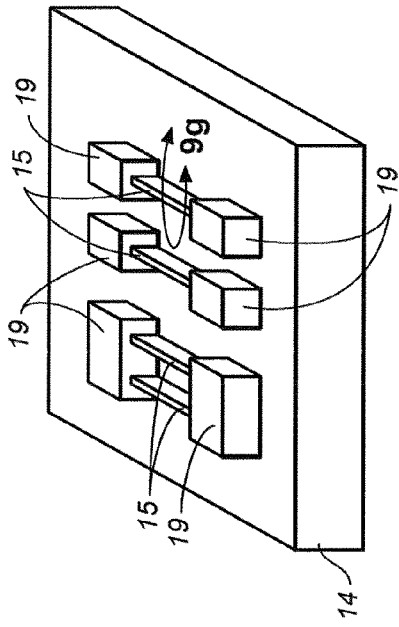
FIG._9f
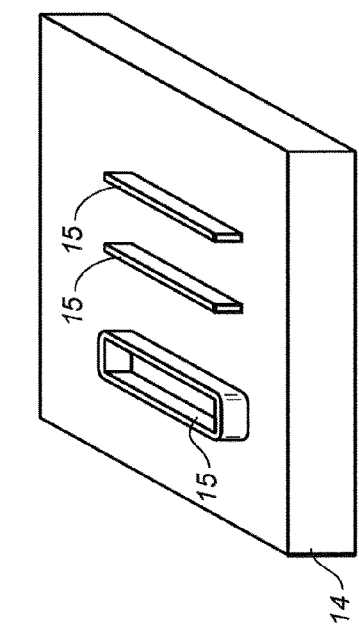
FIG._9e
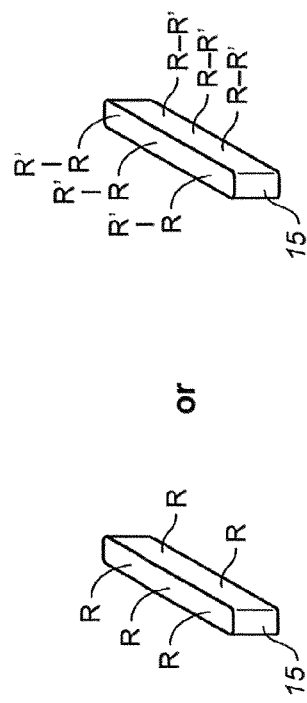
FIG._9g

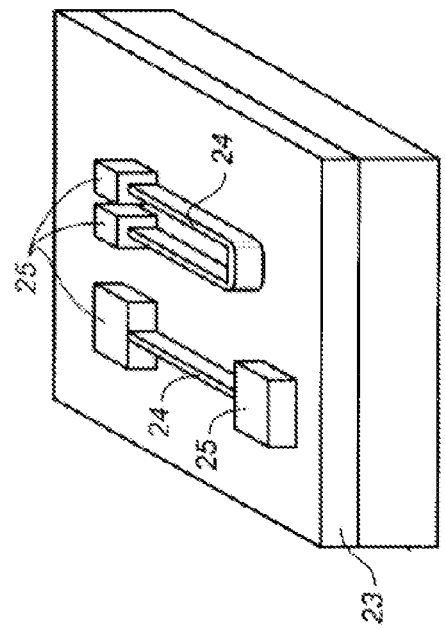
FIG._10b
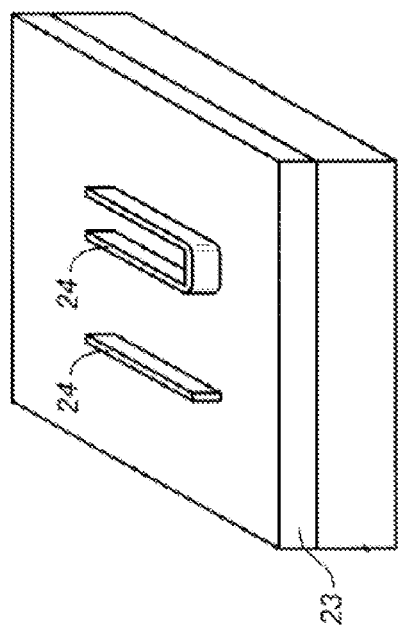
FIG._10a

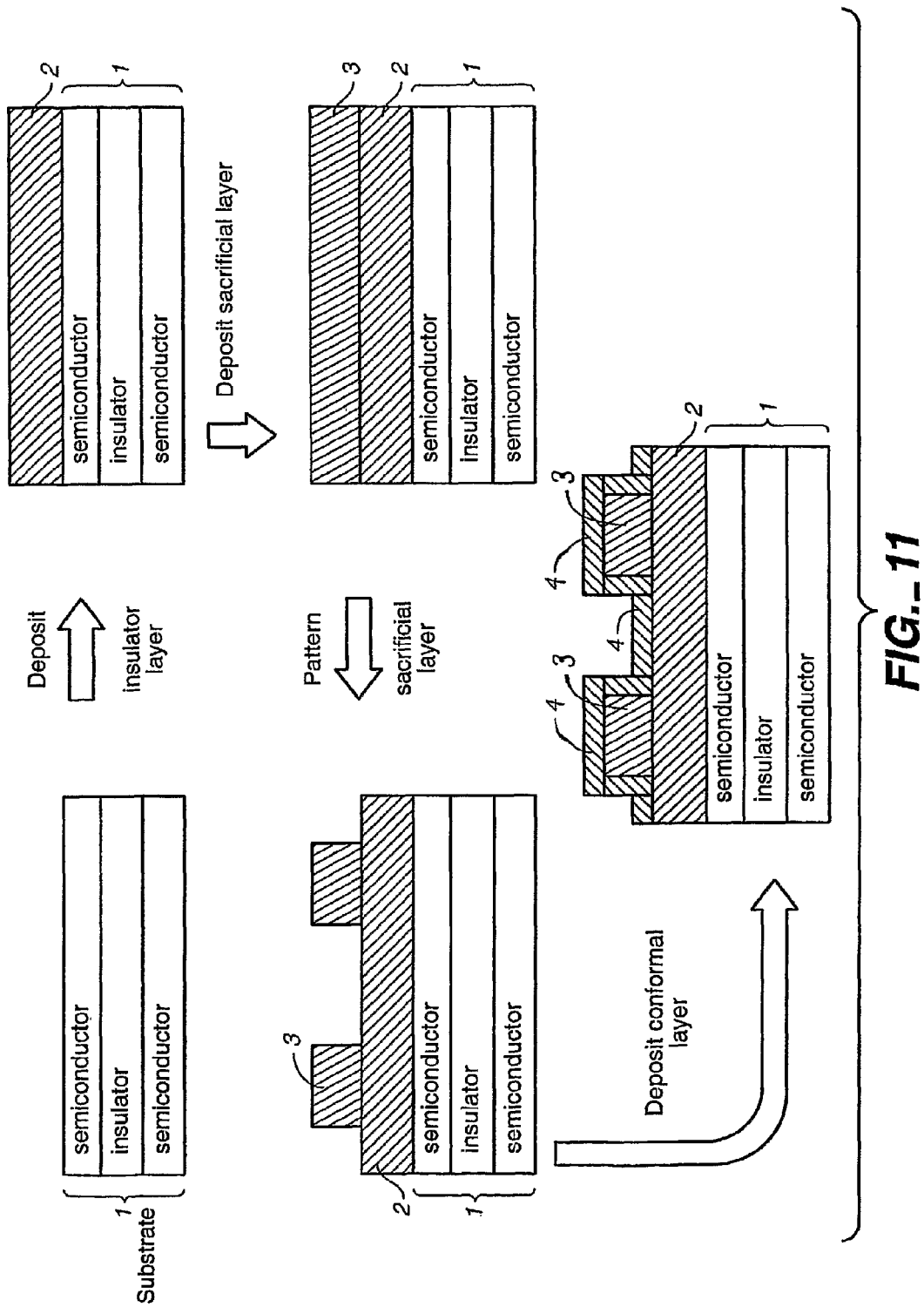
FIG._11

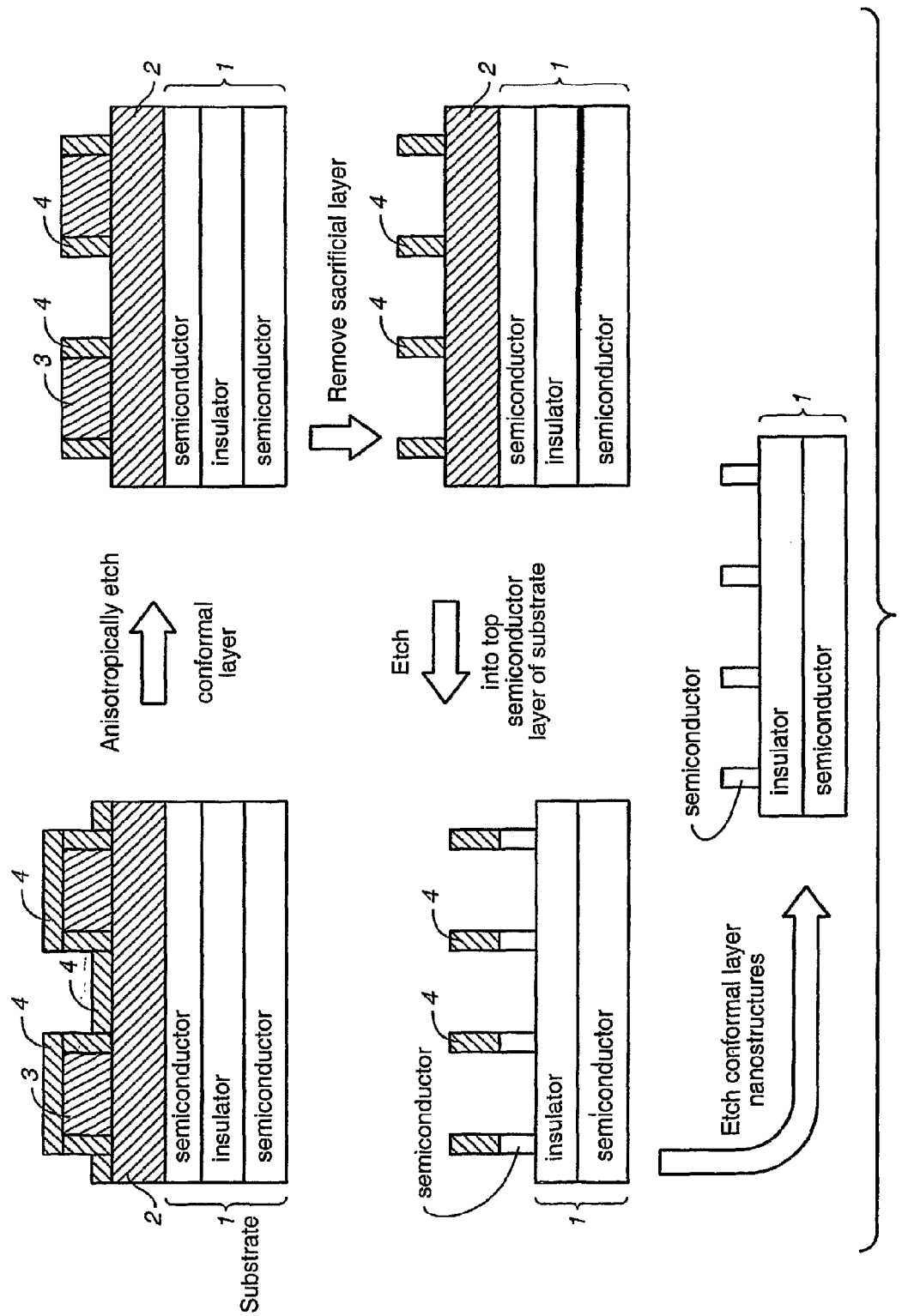
FIG._12

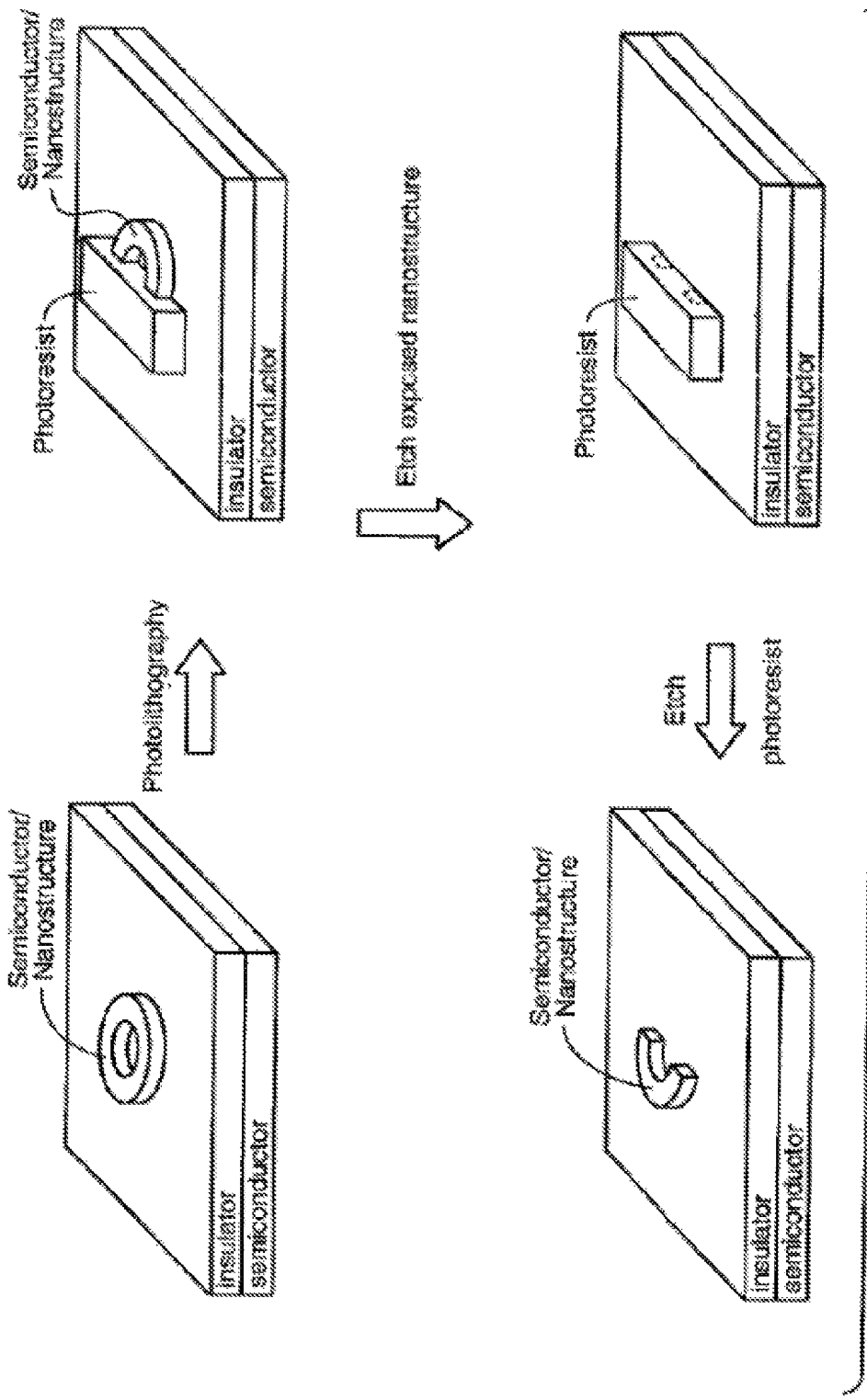
FIG._13

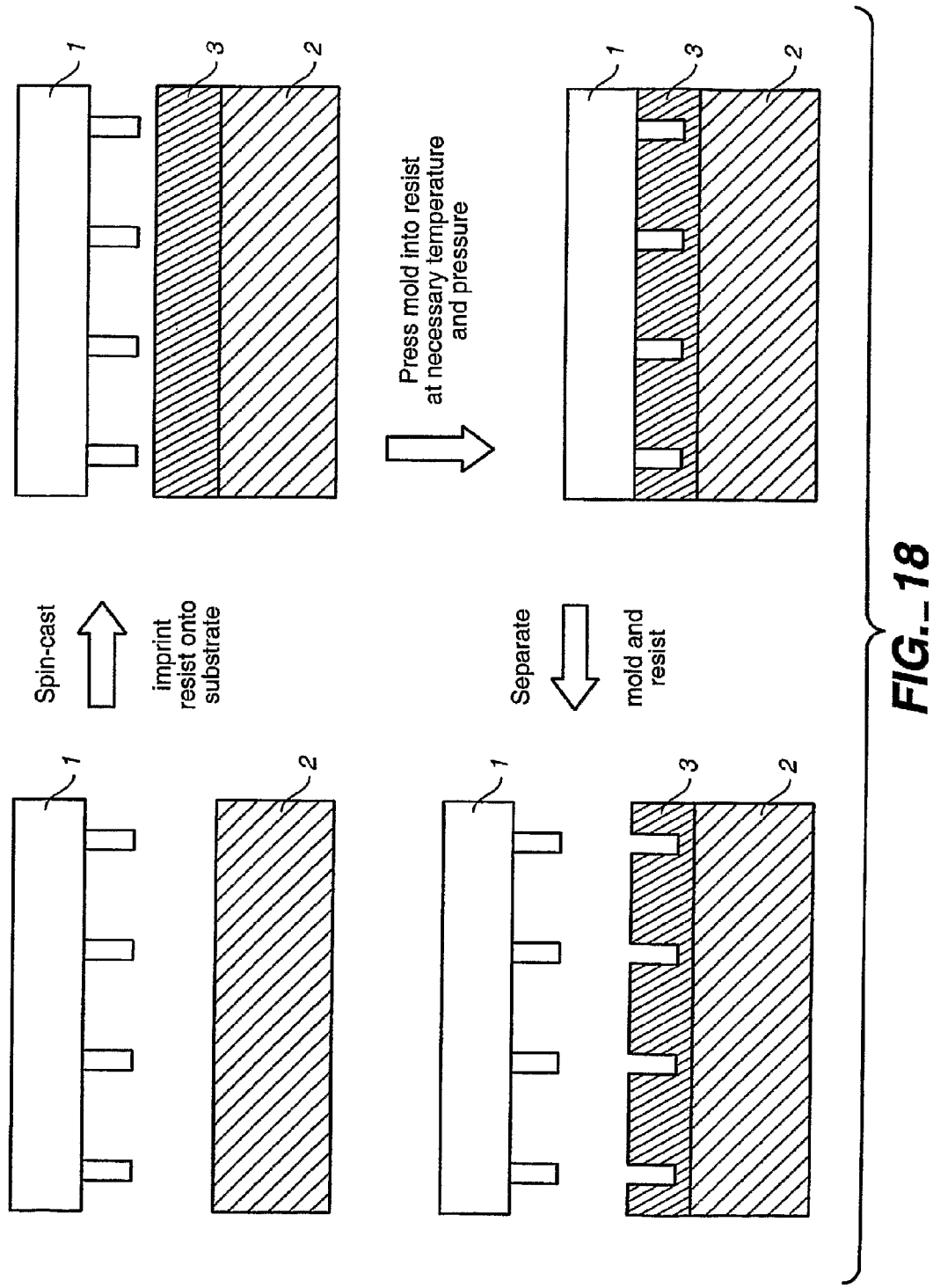
FIG._18

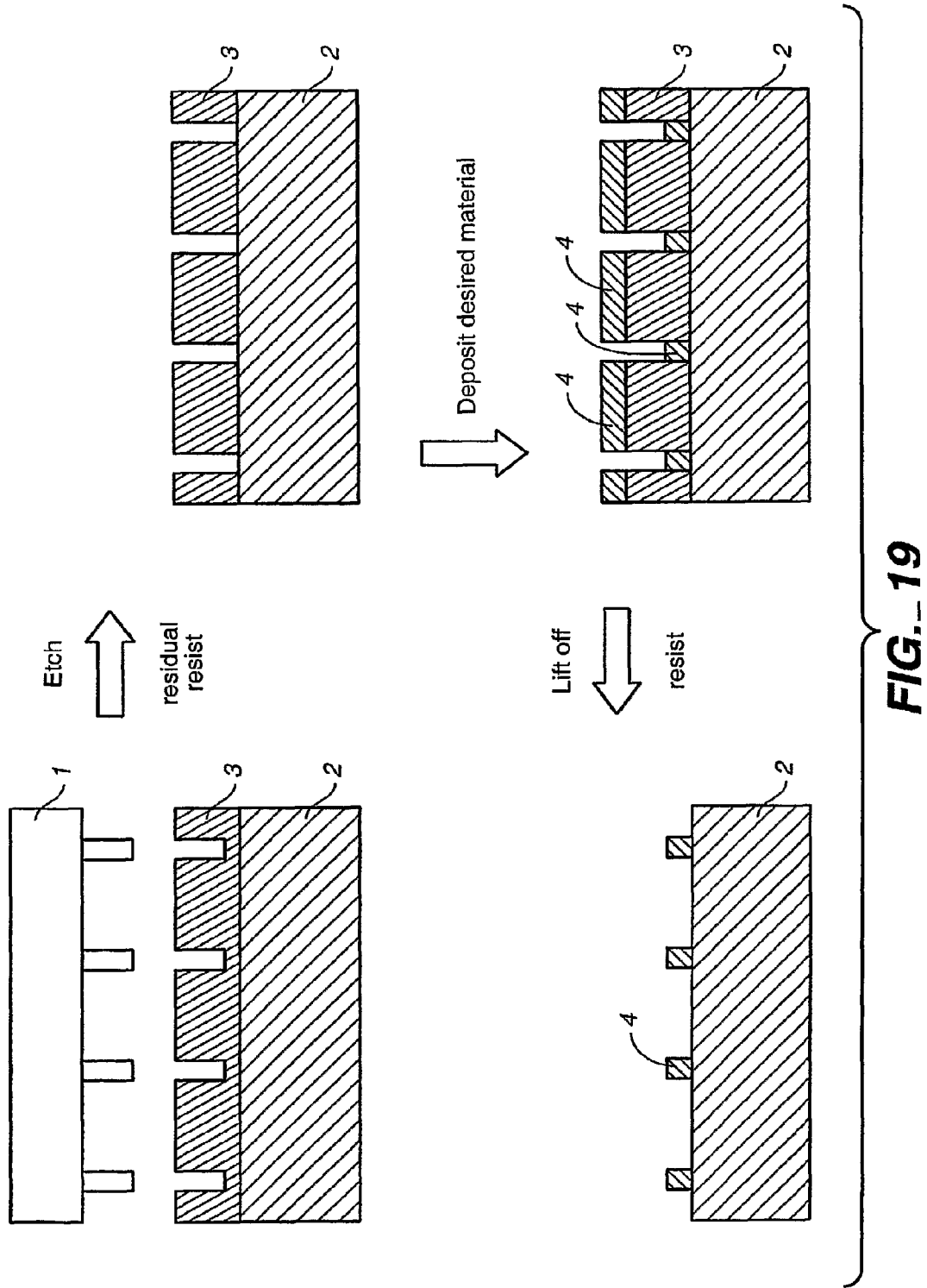
FIG._19

METHODS FOR FABRICATION OF POSITIONAL AND COMPOSITIONALLY CONTROLLED NANOSTRUCTURES ON SUBSTRATE

CROSS-REFERENCE TO RELATED APPLICATIONS

This application claims priority to U.S. Ser. No. 60/554,540, filed Mar. 19, 2004 the contents of which are hereby incorporated by reference in its entirety.

STATEMENT OF GOVERNMENTAL SUPPORT

This invention was made during work supported by U.S. Department of Energy under Contract No. DE-AC03-76SF00098. The government has certain rights in this invention.

BACKGROUND OF THE INVENTION

1. Field of the Invention

The present invention describes methods for patterning a substrate to create a positional and compositionally well defined nanostructures and nanostructure arrays on a wafer scale. The patterned nanostructures have applications in biological and chemical sensing, catalysis, nanocomputing and nanoelectronics.

2. Related Art

Nanostructures are structures with characteristic dimensions less than 100 nm, i.e. nanoscale. Matters can exhibit size dependent properties at this scale due to physical laws governing microscopic objects, which enable novel applications. Despite their novel property, however, an economic and production worthy method of fabricating nanostructures and nanostructure arrays on substrate and making necessary connections for functional devices has yet to be found.

Methods for fabricating nanostructures on substrate fall into two categories, top-down and bottom-up approaches. Conventional top-down approaches such as photolithography, electron beam lithography or ion beam lithography involve creating structures by forming and removing unwanted parts of various films. They are prohibitively expensive for forming devices less than 100 nm. The resolution of photolithography also suffers from the physical limit of the wavelength of the electromagnetic radiation. Although 30 nm resolution has been demonstrated with extremely short electromagnetic radiation, the cost of such a tool is prohibitively expensive. Electron beam lithography and ion beam lithography boast better resolution down to 10 nm, but these methods require the energetic particle beam to visit each spot sequentially and greatly limit the number of devices that can be made in an industrial production environment.

Other novel lithography methods have emerged over the years. Direct write approaches use scanning probe microscopy to deposit molecules on or change physical or chemical properties of the substrate in the proximity of the probe. These methods suffer from slow speed and lack of a general applicability to fabricate functional devices, which limit their use for industrial production.

Imprint lithography is known in the art whereby a mold with nanostructures is pressed into a thin polymer film on a substrate, which retains the thickness contrast relief pattern after removal of the mold. Further process is then used to transfer the pattern into the whole resist. However, imprint lithography does not generate a pattern; it only transfers an existing pattern on the mold. To generate the nanostructure pattern on the mold, another lithography method is required, preferably electron beam lithography. This limitation makes the mold fabrication very expensive and imprint mold made today has very low surface coverage of nanostructure-patterned area.

In bottom-up approaches, nanoscale building blocks are synthesized initially by chemical methods, then selectively added to (rather than removal from) a substrate, followed by making contacts to make a functional device. However, these approaches have limitations on the degree of control they can achieve on each stage of the device fabrication and are not suitable for industrial production.

Nanoscale building blocks that can be chemically synthesized include carbon annotate, nanowire, nanocrystal, nanorod, etc. Most of the synthesis processes produce a multitude of nanoscale products, which have different dimension, composition and shape, therefore, different physical and chemical properties. For example, heterogeneous nanowires synthesized by chemical vapor deposition are shown in *Chem. Mater.* 2000, v 12, p 605-607 (Wu, Y. and Yang, P.). To control the diameter, researchers control the diameter of the catalyst used to grow them, which only shifts the center of a broad distribution of the diameters of materials synthesized, as shown in FIG. 2 of *Appl. Phys. Lett.* 2001, v 78, p 2214. To dope the nanowires, investigators introduce gases containing the dopant during the synthesis, as in *J. Phys. Chem.* 2000, v 104, p 5213. Although no reproducibility is reported, the uniformity of doping is not expected to be good due to the difference in growth rate related to the broad diameter distribution of nanowires.

Assembly of a nanostructure device by depositing building blocks on a substrate for further processing is currently done by liquid assisted methods, such as Langmuir-Blodgett film or fluidic alignment through micromolded channels. They are described in *Nano Letters*, 2003, v 3, p 1255, *Science*, 2001, v 291, p 630, *Science*, 2001, v 291, p 851. These prior art methods suffer from the fact that they can not achieve the degree of position control the modern semiconductor industry has down to 0.01 μm, as shown in FIGS. 2 and 4 of *Science* 2001, v 291, p 630, where broken, double, and tilted lines are seen. The positions are not highly controlled. Another drawback for these methods is that it is still experimental and has a difficult time to scale up for production.

The final step in making nanostructures into a functional device usually requires an electrical connection to a signal processing unit. The lack of positional control in the bottom-up approach in depositing the nanostructures on the substrate makes the final connection-making step difficult. Often the position of each nanostructure has to be determined by microscopy methods such as scanning electron microscopy or atomic force microscopy; then electron beam lithography or other serial lithography is used to make the connections. Or alternatively, preexisting contact structures are fabricated with top-down methods; nanoscale building blocks are then deposited onto these structures with contacts established by chance. Although small quantities of samples have been built using these techniques for lab studies, they are not suitable for large-scale manufacturing.

To address this problem, a novel method is invented to produce high-density nanowire arrays, *Science*, v 300, p 112. Although this method eliminated the nanowire synthesis step and the assembly step, since they have control over the nanowire position, it is still not a production-worthy method on the industrial scale. The method relies on the selective removal of AlGaAs in the AlGaAs/GaAs superlattice, and uses the superlattice as a mold to deposit materials on wafer. The area that can be patterned is defined by the superlattice thickness; to grow a superlattice up to 100 µm is a very time-consuming step. Even so, they can only pattern a 100-µm area at the most, and thus exhibit a slow throughput process. The method is also limited to produce only straight nanowire patterns, and not any other shapes.

Sidewall image transfer (SIT) was invented by the semiconductor industry in early 1980s to produce sublithography images and spaces for the formation of polysilicon gate in sub-micron range. Briefly, a vertical step is created on a planar substrate, which is covered by conformal deposition of a silicon oxide, preferably silicon dioxide or nitride. The resulting gate length is approximately equal to the thickness of the layer deposited. More details can be found in U.S. Pat. Nos. 4,358,340, 4,419,809, 4,419,810, 5,139,904, and 5,795,830. A more recent application of this method is towards the fabrication of FinFET, as disclosed in *IEEE Device Letters,* 2002, v 23, p 25 and *Solid-State Electronics,* 2002, v 46, p 1595, the contents of which are hereby incorporated by reference in its entirety for all purposes.

Despite its ability to create sublithography patterns, SIT has only been applied to specific materials, namely Si and polysilicon, and to specific devices such as transistors. The minimum feature dimension can be achieved by this method is on the order of 20 nm and thus limits its application in creating nanostructures.

A need exists for methods that can fabricate positional, compositionally and shape controlled nanostructures and nanostructure arrays on a substrate to enable large-scale manufacturing.

Imprint lithography can transfer nanoscale patterns on a large area, but it can not generate patterns. Existing methods for fabrication of nanostructures with imprint lithography depend on electron beam lithography to make the nanoscale patterns in a mold, which can be very expensive for mold with high nanoscale pattern coverage. The present invention contemplates that nanoscale patterns can be made on a substrate, which can then be used as mold in imprint lithography.

Nanowire biosensors have been discussed in the literature, *Science* 2001, v 293, p 1289 and *Nano Letters,* 2004, v 4, p 51, the content so both are hereby incorporated by reference in its entirety. These sensors are assembled from CVD-synthesized nanowires, and they are difficult to manufacture on an industrial scale. Sensors of the prior art do not have the compositional and positional control over the nanostructures that arrays and sensors made in accordance with the present invention possess. In general, the sensors include nanotubes or nanowires in contact with electrodes, thus forming a circuit for current flow. The sensing occurs when analytes contact the nanotubes or nanowires. Chemical sensors based on $TiO_2$ nanowire are also reported. The present invention contemplates that nanoscale sensing devices may be manufactured cheaply in mass.

SUMMARY OF THE INVENTION

In accordance with one aspect of the present invention, a method for fabricating positional and compositionally controlled nanostructures is disclosed. In one embodiment the method comprises:
(a) forming a nanoscale thin film of desired nanostructure material composition on the substrate and optionally covering it with a protective layer;
(b) forming a sacrificial layer on top of the protective layer and patterning the sacrificial layer by conventional or advanced lithography;
(c) depositing a thin conformal layer over the patterned sacrificial structure which has different etching characteristics than the sacrificial layer;
(d) anisotropically etching the conformal layer to expose the sacrificial layer and removing the sacrificial layer by selective etching;
(e) transferring the resulting conformal layer structure through the protective layer to the nanoscale thin film of desired material by etching, and removing the remaining conformal layer structure and protective layer;
(f) depending on application, the resulting nanostructures in the thin film can be further reduced in dimension by controlled etching or converting to a material that has different etching characteristics and removing the material through selective etching;
(g) depending on application, the shape of the nanostructure can be modified by standard lithography and etching to remove unwanted parts of the above fabricated nanostructures.

In accordance with another aspect of the invention, a method for fabricating positional and compositionally controlled arbitrary shape nanostructures on a substrate is provided. In one embodiment the method comprises:
(a) optionally forming a protective layer on a substrate;
(b) forming a sacrificial layer on top of the protective layer and patterning the sacrificial layer by conventional or advanced lithography;
(c) depositing a thin conformal layer over the patterned sacrificial structure which has different etching characteristics than the sacrificial layer;
(d) anisotropically etching the conformal layer to expose the sacrificial layer and removing the sacrificial layer by selective etching;
(e) transferring the resulting conformal layer structure through the protective layer to the nanoscale thin film of desired material by etching, and removing the remaining conformal layer structure and protective layer;
(f) depending on application, the resulting nanostructure pattern in substrate can be further reduced in dimension by controlled etching or converting to a material that has different etching characteristics and removing the material through selective etching;
(h) depending on application, the shape of the nanostructure can be modified by standard lithography and etching to remove unwanted parts of the above fabricated nanostructures.
(g) the above nanostructure pattern in substrate then can be used as mold in imprint lithography and create positional and compositionally controlled nanostructures by a lift-off process or an etching process, both of which are well-known in semiconductor industry.

The above fabrication methods, as employed herein, can create at least one nanoscale pattern, a multiple of patterns, of specific predetermined position, shape and composition, patterns over a large area at high throughput satisfactory for industrial requirement. The resultant nanostructure patterns are useful for nanostructure arrays, specifically sensor and catalytic arrays.

In one embodiment, the fabrication process of a nanoscale semiconductor sensor array for detecting analytes is provided, with preferred applications in chemical and biological sensing. Two conductive elements connect the nanostructures to a signal control and processing unit. In one arrangement, the conductive elements are fabricated within the said thin semiconductor layer, see FIG. 9*d* ref. num 15. In another arrangement, the conductive elements are formed on the nanostructure using standard lithography, see FIG. 9*f* num 19.

In some arrangements, sections of the nanostructure can be suspended from the substrate. The said nanostructure semiconductor then can be functionalized with specific molecules for detection of certain molecules.

In another embodiment, the fabrication method of a nanoscale oxide sensor array for detecting analytes is provided, with preferred applications in gas phase sensing. A mold with nanostructure features is fabricated by the second method, and is pressed against a substrate coated with a polymer resist to transfer pattern. Upon separation, the pattern is transferred all the way through the resist by etching. In one arrangement, the desired composition of materials is then deposited on the resist layer. When the resist is dissolved in solution, nanostructures with desired composition are left on the substrate. In another arrangement, a masking material is deposited on the resist layer. Following the dissolution of the resist layer, the masking material that is left on the semiconductor surface can then be used to transfer the nanostructure pattern into the substrate. Two conductive elements can be made to each of the nanostructures by standard lithography methods.

A method for detecting analytes is also provided. The resistance of each of the sensor elements in the sensor arrays fabricated by the two said methods is measured before and after exposure of the sensor arrays to a sensing environment. Resistance change of each of the sensor elements is then correlated to the detection of the specific analyte the sensor is designed to measure. Optimizing the sensor design by control of the dimension, shape and composition can lead to detection at very low levels, i.e. and ppt concentrations.

Future features and advantages of the present invention will become apparent to those of ordinary skills in the art in view of the detailed description of preferred embodiments below, when considered together with the attached drawings and claims.

BRIEF DESCRIPTION OF THE DRAWINGS

FIG. 1a-1b is a block diagram for forming an array in accordance with one embodiment of this invention FIG. 2 is a schematic drawing of a size reduction lithography process in accordance with one embodiment of the present invention.

FIG. 3a is a SEM of a cross section of an array after thin LTO deposition (44 nm)

FIG. 3b is a SEM of a cross section of an array after thick LTO deposition (200 nm).

FIG. 3c is a SEM of a cross section of an array after the top LTO layer and poly-Si layer have been etched away from the structure FIG. 3d is a SEM of a cross section after the top LTO layer and poly-Si have been etched away from the structure.

FIG. 3e is a SEM cross section of a 20-nm Si nanostructure array made from size reduction lithography FIG. 3f is a SEM to view of the 20-nm Si nanostructure array of FIG. 2e.

FIG. 4a is SEM cross section of a 12-nm Si nanostructure array made after thermal oxide trimming. Inset HRTEM image shows the single crystalline nature of the Si nanowire.

FIG. 4b is a SEM cross section of a 7-nm Si nanostructure array made after further thermal oxide trimming.

FIG. 5a-5g is a block diagram of a method in accordance with one embodiment of the present invention.

FIG. 6a-6d is a block diagram of a method in accordance with one embodiment of the present invention. FIG. 6b shows closed ended nanostructures, FIG. 6d shows open ended nanostructures.

FIG. 7a-7f is a block diagram of a method in accordance with one embodiment of the present invention.

FIG. 8a-8e is a method in accordance with one embodiment of the present invention utilizing imprint lithography.

FIG. 9a-9g is a block diagram of a method in accordance with one embodiment of the present invention.

FIG. 10a-10b is a depiction of an array and sensor in accordance with one embodiment of the present invention.

FIG. 11 is a method in accordance with one embodiment of the present invention.

FIG. 12 is a method in accordance with one embodiment of the present invention.

FIG. 13 is a method in accordance with one embodiment of the present invention.

FIG. 18 is a method in accordance with one embodiment of the present invention.

FIG. 19 is a method in accordance with one embodiment of the present invention.

DETAILED DESCRIPTION OF PREFERRED EMBODIMENT

Figure 14:
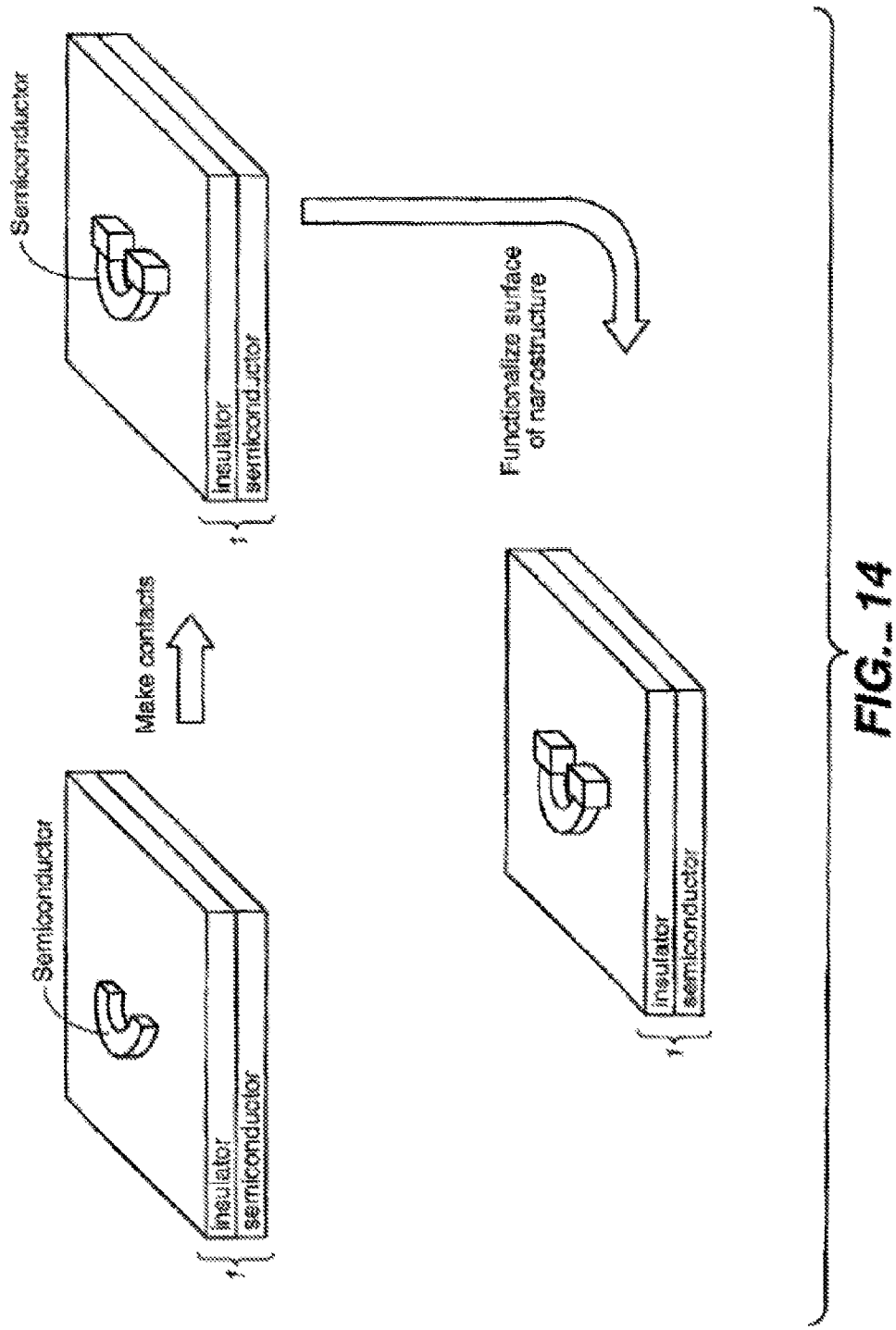
FIG. 14 is a method in accordance with one embodiment of the present invention.

By "substrate" it is meant a layer or layers of materials on which the nanostructure array can be fabricated. The substrate may be a single layer of Si, preferably as pure as possible, preferably at least 99.9% pure. The substrate may be transparent (as for use in an optoelectronic device) or opaque. Generally the thickness of the substrate, whether it is one or multiple layers, is between 500 nm and 1 mm, but this can vary depending on the intended use.

Silicon is a preferred material for the substrate. However, also contemplated as materials include $SiO_2$, Group II-VI and Group III-V semiconductors, any glass or quartz, sapphire, polished metals providing they have an insulating coating. The wafer size may be any size depending on the manufacturing parameters. For the purpose of fabricating a functional device, it is to be understood that the substrate preferably has either have an insulator material thereon, or the substrate comprises an insulator, such as $SiO_2$, $Al_2O_3$ or other insulating material. Oxides are preferred because they are capable of processing at high temperatures. The insulating layer may be grown, deposited by any CVD technique, sputtering or evaporation or ion implantation.

By "SOI" it is meant "silicon on insulator". This is a substrate comprising multiple layers, that Si/insulator/Si. The top layer and bottom layer may be substituted for other materials as described herein, for the present invention. A preferred thickness for SOI substrate is between 500-700 μm. The thickness for the oxide layer here, and for insulator layers used herein in general ranges from between 5 nm to about 100 μm; preferred thickness is 50 nm to 100 nm. The thickness of the single crystal Si layer ranges from 0.5 nm to about 500 nm; preferred thickness is 5 nm to 50 nm.

By "polysilicon" it is meant a contraction of "polycrystalline silicon".

By "silicon oxide, silicon nitride" it is meant all stoichiometric ratios of the compounds.

By "forming a nanoscale thin film" it is meant to include the process of providing a substrate and growing, depositing, bonding or otherwise providing materials in the film format. The film thickness can range from 0.5 nm to 500 nm, preferred thickness is 5 nm to 100 nm. The materials can be conductor, semiconductor or insulator in single crystal, polycrystalline or amorphous state. Preferably, it is single crystal Si. Ge or other semiconducting materials may also be used. $Si_xGe_{1-x}$, where $0.01 \leq x \leq 0.99$, where x is mol % are also contemplated. Conducting polymers known in the art are also contemplated. The film can also comprise more than one layer of materials, with materials for each layer chosen from the above-mentioned materials.

By "thin conformal layer" it is meant a layer having a thickness from about 1 nm to about 1 μm, depending on the desired end product. Preferably the thickness is less than about 50 nm. Methods for forming a conformal layer include, but are not limited to chemical vapor deposition, spin coating or by converting the underlying layer through chemical reaction such as oxidation or nitrification and low pressure chemical vapor deposition, etc.

By "nanostructure" is meant that at least one, preferably two, of the structure's three dimensions is measured in nanometers. The height and width of the nanostructures in accordance with preferred embodiments of the present invention are between about 0.5 and 100 nm, preferably between 5-50 nm.

By "array" it is meant a substrate having at least one nanostructure thereon.

By "anisotropically etching" it is mean removing material with one preferred direction. Preferred methods for performing anisotropic etching are based on plasma etching.

By "positional controlled" it is meant the ability to fabricate a nanostructure on a substrate and control the placement of the nanostructure within about 20 nm or less. The predetermined position for a nanostructure is determined by the selection of any desired specific location on a wafer from any particular or specific point on the nanostructure or nanostructures. Positional control also means different nanostructures may be fabricated having a specific predetermined location on the wafer with respect to one another or others.

By "photolithography" it is meant lithographic techniques using any wavelength, including extreme UV.

By "compositionally controlled" it is meant that the method of the present invention is capable of fabricating nanostructures having any material, compositions and stoichiometric ratios thereof, including multiple layers vertically. The present invention contemplates that as many as 100 layer or more can be in 1 nanostructure.

By "etching characteristic" it is meant etching selectivity.

By "pattern" it is meant a design of specific intention that carries with it a specific shape which may include circular, corrugated, elliptical, oblong, oval, parabolic, rectangular and segments or parts of the aforementioned shapes. Complex shapes are also possible, limited only by the imagination. The pattern may be continuous or discontinuous. The thickness or width of the pattern nanostructure does not have to be uniform, but may vary. The height of the pattern may change. FIG. 3f shows an example of a pattern in accordance with one embodiment of the present invention.

By "detecting" it is meant that meaning which is associated in the art with this term, such as observe, find, discover, notice, discover or determine the existence, presence, change or any other condition or state.

By "at least one nanostructure in the top layer" it is meant that the nanostructure is structurally integral with the top layer. This means, that the top layer is the nanostructure. The nanostructure was made from the top layer of a substrate, for example SOI, where the silicon was the top layer initially, and in the top layer everything but the nanostructure has been etched away.

By "insulating layer" it is meant materials capable of insulating electrical current flow from the device. Typically, metal oxides are used. Preferred for use in this invention are SiOx, where $0.5 \leq x \leq 2$.

By "predetermined position" it is meant that the nanostructures are positioned on the substrate with precision and accuracy. The method of the present invention is capable of positioning a nanostructure on the substrate within at least 20 nm of a predetermined position.

By "perovskites" it is meant to include $LaFO_3$, $SmFeO_3$ and

The present invention contemplates controlling the shape of the nanostructures by controlling the shape of the pattern in the mold or by the shape of the pattern in the sacrificial layer.

The present invention contemplates controlling the length of the nanostructures by controlling the length of the pattern in the mold or by the length of the pattern in the sacrificial layer.

The present invention contemplates controlling the position of the nanostructures by controlling the position of the pattern in the mold or by the position of the sacrificial layer.

Size reduction of nanostructures made in accordance with the present invention may be accomplished by producing a 20 nm (silicon, preferred) nanostructure and oxidize it at 800° C. for 20 minutes followed by HF dipping to remove the oxide. This treatment reduced the silicon dimension to ~12 nm, as shown in FIG. 3(a). A high-resolution transmission electron microscopy (HRTEM) image also shows the single crystalline nature of the Si nanowire. Further oxidation at 800° C. for 10 minutes reduced the silicon dimension to ~7 nm, as shown in FIG. 3(b). The concave shape of the cross section of Si nanowire is due to lower oxidation rate for concave and convex surfaces (top and bottom) than planar surface (middle).

The nanostructures of the present invention are preferably doped. Doping of semiconductors is well known in the art, see for example Cui. et al. *J. Phys. Chem*. B 104, 5213 (2000), Cui et al. *Science* 291, 851 (2001) and Duan et al. *Nature* 409, 66 (2001), the contents of which are hereby incorporated by reference in its entirety. Boron and phosphorus may be doped to provide p-type and n-type materials, respectively. Dopant concentration is controlled depending on the sensitivity desired of the resultant device. Techniques such as epitaxial overgrowth, diffusion, ion implantation are contemplated Nanostructures have a large surface to volume ratio, which make its property sensitive to environmental perturbation on the surface. Especially, current flows through nanostructures within the proximity of the surface, electrical change due to the adsorption or desorption of molecules on the surface can influence the electron flow, which makes nanostructures good sensing devices.

The present invention contemplates that the nanoarrays made in accordance with the present invention are capable of use as chemical and biological sensors and catalytic devices. In one embodiment of the present invention contacts are attached to the nanostructures by standard lithographic techniques. The present invention contemplates that the in one embodiment the nanosensor described herein has a nanostructure that bridges the gap between two contacts through which electrical current may pass. Sections of the nanostructure may be suspended from the surface. Any changes in the properties of the nanostructure changes the electrical current and the measurement may indicate the presence of an analyte. The invention contemplates that the analyte may be in any phase, such as solution or gas. Arrays according to this invention are capable of being constructed as a gate-less field effect transistor (FET) by functionalizing the nanostructure array with molecules, compositions or membranes capable of binding (ionically, covalently, van der walls or any other interaction, chemical or physical) with a target molecule of interest. The binding will then result in an increase or decrease in the carriers in the FET structure. Sensors constructed in accordance with the method of the present invention are capable of single molecule detection. Another advantage of sensors in accordance with the present invention is the possibility of dense arrays of nanostructures, which would further increase sensitivity.

A nanostructure device constructed according to the present invention may be made into a sensor device by functionalizing the surface of the nanostructure with a substance capable of responding in some way to the presence of a target molecule. The nanostructure array of the present invention is different from a typical FET because the surface is not covered by a metal gate, but is instead functionalized. When the target molecule contacts the functionalized surface of the nanowire a change in nanostructure electrical property (for example, conductance) or optical property occurs. The choice of functionalized substance/target molecule for use in accordance with this invention may be one well characterized in the art, for example the biotin-streptavidin ligand-receptor relationship. Other materials known in the art are also suitable as functionalized receptors or ligands for target molecules or analytes are calmodulin for sensing $Ca^{2+}$ ions. Single stranded DNAs, antibodies, proteins are all contemplated as suitable for use as as functionalizing molecules. Other possibilities are any photoactive molecule, photonic nanoparticle, inorganic ion, inorganic nanoparticle, magnetic ion, magnetic nanoparticle, electronic nanoparticle, metallic nanoparticle, metal oxide nanoparticle, gold nanoparticle, gold-coated nanoparticle, carbon nanotube, nanocrystal, quantum dot, protein domain, enzyme, hapten, antigen, biotin, digoxygenin, lectin, toxin, radioactive label, fluorophore, chromophore, or chemiluminescent molecule. It is contemplated that any molecule whose presence is a diagnostic of a particular human pathogenic organism, such as bacteria, protozoa, fungi, viruses and prions may be used.

The sensor may have a biologically and chemically protective coating that will inhibit non-specific interactions of non-targeted analytes. This may include a surfactant or lipid layer, a polymer layer or a micellar layer.

The invention also contemplates that a multitude of nanosensor arrays in accordance with the present invention may be functionalized with different organics and used to detect an array of molecules in parallel. Thus it is contemplated that one nanostructure is functionalized differently than another nanostructure. There may be 100, or 1000 or more nanostructures functionalized differently.

Inhibiting materials may cover the regions adjacent the nanostructures. The inhibiting material may be chosen depending on the desired use, but it must be impermeable to at lease one chemical, biochemical or biological target molecule. The inhibiting material layer may be impermeable to the target molecule, or semipermeable to the target molecule.

Electrical contacts to the sensor arrays may be made in accordance with those methods known in the art, such as electron-beam lithography, ion beam lithography, or photolithography. Suitable materials for the contacts include aluminum, titanium, titanium-tungsten, platinum, gold and copper.

The nanostructure sensor device may be configured to detect electrical signals before and after exposure to an analyte. Changes in signals can be related to detection of the analyte. Thus the sensor of the present invention may be coupled to a signal control and processing unit.

The drawings and figures used to describe the present invention are not necessarily to scale. Furthermore, the reference characters used when describing a particular embodiment are not necessarily carried over so as to represent the corresponding parts when describing a different embodiment.

EXAMPLES

The following examples describe and illustrate aspects and features of specific implementations in accordance with the present invention. It should be understood the following is representative only, and that the invention is not limited by the detail set forth in these examples.

Example 1

Nanostructures/Nanostructure Arrays

The fabrication of one embodiment of the nanostructures/nanostructure arrays in accordance with the present invention is described below. Referencing FIG. 1a and FIG. 1b, a substrate (1) is provided. On top of which a sacrificial layer is deposited, (2). Via lithography, the sacrificial layer was patterned. A thin conformal layer (3) was then deposited on top of the patterned sacrificial layer. The conformal layer was anisotropically etched to expose the sacrificial layer. The sacrificial layer was then selectively removed. FIG. 1a shows the conformal layer structure process as it was transferred into the substrate with further etching. This conformal layer structure was then removed leaving nanostructures/nanostructure arrays of the same material as the substrate. The present invention contemplates the controlling of the height, width, length, shape, spacing, position, doping level, and/or composition of the nanostructures/nanostructure arrays.

Example 2

Forming Nanostructures in One Embodiment of the Present Invention

Referencing FIG. 2: Si(100) was used as the starting material, this is a preferred embodiment only, and not limiting. A 50~70 nm thermal oxide layer was grown on the Si wafers in a water stream and oxygen at 850° C. The optimal thickness of the thermal oxide was chosen from these two functional considerations. The layer should be thick enough to protect the substrate during the removal of the sacrificial polysilicon layer, while a thin layer is desired to minimize pattern broadening when forming the hard mask for subsequent silicon etching. A thin layer of polysilicon was deposited by low-pressure chemical vapor deposition using $SiH_4$ at 600° C. as the sacrificial layer. For improved mechanical stability, the layer thickness is 100 nm for generating Si features with sizes less than 30 nm and 400 nm for larger Si nanostructures. The polysilicon layer was then patterned by photolithography with a GCA 6200 wafer stepper, the resolution of which was around 600 nm. The pattern was transferred from the photoresist layer to the poly-silicon layer by plasma etching in a Lam Research 9400 TCP etcher. The conditions were 50 sccm $Cl_2$, 150 sccm HBr, pressure 15 mtorr, electrode temperature 50° C., 300 W top electrode power and 150 W bottom electrode power with a bias of −160 V. This recipe etched polysilicon with a speed of ~7 nm/s and produced a nearly vertical sidewall profile with an angle >89.5°. It is also important to remove the polymers after the polysilicon etching. The estimated residue polymer thickness was 20~30 nm, which would significantly enlarge the nanometer pattern desired. The post etch step for the removal of the polymer was to dip the wafer in (100:1) HF for 10 s, strip the photoresist with oxygen plasma, followed by (100:1) HF 10 s then piranha [(4:1) $H_2SO_4$:$H_2O_2$] treated at 120° C. Low temperature oxide (LTO) was deposited by low pressure chemical vapor deposition over the patterned polysilicon layer. The conditions were 5 sccm $SiH_4$ and 70 sccm $O_2$ at 450° C. The deposition rate was ~3 nm/min. The step coverage is ~70% for thin films (<50 nm) and ~60% for thicker films, as shown in FIGS. 3(a) and 3(b), respectively. The thickness of the deposited LTO on the sidewall determines the minimum feature size. Anisotropic plasma etching was used to remove the LTO on the top of the sacrificial structure and open the polysilicon structure (FIG. 2f). The conditions were: 100 sccm $CF_4$, pressure 13 mtorr, 200 W top electrode power and 40 W bottom electrode power with a bias of −80 V. The etching speed was ~2 nm/s for LTO. This recipe also etches polysilicon and single crystal silicon with almost the same speed as for LTO. The polysilicon sacrificial layer was then removed with either wet etching or plasma etching (FIG. 2g). Wet etching was conducted in 1:2$_w$ KOH aqueous solution at 80° C.; the etching speed was around 17 nm/s for poly-silicon and 0.1 nm/s for LTO. Due to the etching non-uniformity, the complete removal of poly-silicon is generally not achieved until 2 minutes and this will severely undercuts the LTO spacer at 10 nm scale. Therefore, wet etching is not used for spacers smaller than 30 nm and plasma etching is used instead. The polysilicon plasma etching process is the same as the process for transferring pattern from photoresist into polysilicon layer and the etching selectivity of polysilicon to LTO is 22. The LTO pattern was then transferred to the thermal oxide layer by plasma etching with conditions 100 sccm $CF_4$, pressure 13 mtorr, 200 W top electrode power and 40 W bottom electrode power (FIG. 2h). The resulting oxide pattern sidewall profile after this etching is not ideally vertical, showing some broadening for smaller spacers (<30 nm, FIG. 3(c)) and a noticeable undercut for larger spacers (>50 nm, FIG. 3(d)). The oxide pattern was transferred to silicon by plasma etching with conditions 50 sccm $Cl_2$, 150 sccm HBr, pressure 15 mtorr, electrode temperature 50° C., 300 W top electrode power and 150 W bottom electrode power (FIG. 2i). 20 nm silicon nanostructures can be routinely fabricated with this process, as shown in FIG. 3(e) and FIG. 3(f).

To reduce the silicon size further, the resulting 20 nm silicon nanostructure was oxidized at 800° C. for 20 minutes followed by HF dipping to remove the oxide. This treatment reduced the silicon dimension to ~12 nm, as shown in FIG. 4(a). A high-resolution transmission electron microscopy (HRTEM) image also shows the single crystalline nature of the Si nanostructure. Further oxidation at 800° C. for 10 minutes reduced the silicon dimension to ~7 nm, as shown in FIG. 4(b). The concave shape of the cross section of Si nanostructure is due to lower oxidation rate for concave and convex surfaces (top and bottom) than planar surface (middle).

Example 3

Nanostructure Fabrication by Sidewall Image Transfer

Referring now to FIG. 5a-5f where one embodiment in accordance with the present invention where fabricating a controlled nanostructure is illustrated. FIG. 5a is a cross section view of the basic film stack. A nanoscale thin film 2 with desired chemical composition is formed on top of a substrate 1, which may comprise an insulating layer for electrical devices. A sacrificial layer 4 has been deposited on top of an optional protection layer 3. The substrate and nanoscale thin film are defined above, and the preferred embodiment is SOI wafer. The thickness of the nanoscale Si film can be reduced further by limited oxidation and removal of the oxidized portion of the film. The optional protection layer 3 prevents unintended damage or removal of the nanoscale film 2 and it can be formed by but not limited to either physical vapor deposition, chemical vapor deposition or direct growth by oxidation or nitrification of the film 3. The preferred material is silicon nitride or a silicon oxide, preferably silicon dioxide. The sacrificial layer 4 is a material that can be removed later by etching; the preferred material is polysilicon or a silicon oxide, preferably silicon dioxide. The sacrificial layer 4 can be patterned by standard lithography and etching, the pattern of which is shown in FIG. 5b, which is a cross section view. Examples of lithography techniques suitable for this invention are photolithography, electron beam lithography, ion-beam lithography, etc, preferably photolithography. Etching is achieved either in a plasma environment (dry etching) or in a solution environment (wet etching), preferably dry etching. A conformal layer 5 is then deposited on the fabricated pattern, as in FIG. 5c, followed by an anisotropic etch to remove all the conformal layer 5 except on the sidewall of sacrificial layer pattern 4, as depicted in FIG. 5d. The conformal layer 5 should have a different etching characteristics than the sacrificial layer 4 so that either material can be selectively removed while remove very little of the other, such material pairs comprise, but not limited to polysilicon and silicon oxide, polysilicon and silicon nitride, silicon oxide and silicon nitride, photoresist and polysilicon, alumina gallium arsenate and gallium arsenate, etc. The preferred material pair is polysilicon and a silicon oxide, preferably silicon dioxide.

Once the sacrificial layer 4 is exposed, it can be selectively removed by either dry or wet etching. FIG. 5E shows the remaining conformal layer structure 5 has approximately equal width to the film thickness, which can be less than 50 nm. This sublithographic images then can be transferred through the protective layer 3 into the desired nanoscale film layer 2 by etching or ion milling, as shown in FIG. 5f. After removal of the protective layer 3, nanostructures with any desired chemical composition are fabricated in layer 2, as shown in FIG. 5g.

The present invention contemplates that the width of the nanostructure can be further reduced by either controlled etching or converting to a material that can be selectively removed. In one embodiment of the present invention, polymer nanostructures can be further reduced in size by controlled etching in oxygen plasma. In another embodiment of the present invention, Si nanostructures can be further reduced in size by thermal oxidation to convert to $SiO_2$, which then can be removed by HF etching. In another embodiment of the present invention, Si nanostructures can be further reduced in size by controlled $XeF_2$ etch.

Example 4

Controlling the Position, Length and Shape of Nanostructure

The position, length and shape of the nanostructures may be predetermined by the initial pattern in the sacrificial layer 4 (FIG. 5), but can also be modified after fabrication. FIG. 6a is an example of a 3-D view of two different shapes of patterns created in the sacrificial layer 4, one is a rectangle, the other is a circle. The shapes are determined by standard lithography, and these specific shapes provided are intended as examples, not as limitations. FIG. 6b shows the shape and position of the nanostructures 2 created on the substrate 1. The shape of the nanostructure follows the boundary of the sacrificial layer pattern 4, and the position of the nanostructure is determined by the position of the sacrificial layer pattern 4.

Since the position of the nanostructure can be predetermined, standard lithography methods, preferably photolithography, can be applied to change the length and/or shape of the nanostructure by masking the desired part with resist 6 and removing the exposed part with etching techniques, as illustrated in FIG. 6c. In one embodiment contemplated by the present invention, one can mask half of the structure off and remove the other half. This will result in the fabrication of half circle and half of the rectangle on the substrate 1, shown in FIG. 6d. Accordingly any complex shape can be accomplished.

The present invention contemplates the formation of an open ended structure as in FIG. 6d, a closed ended structure as in FIG. 6b, or both.

Following the teaching of the method, one can readily appreciate that the present invention contemplates controlling the composition of the nanostructures by forming a thin film of desired composition on a substrate. Further, the present invention contemplates controlling the height of the nanostructures by either timed etching into the desired film or the thickness of the desired film. The preferred method is by controlling the thickness of the desired film. The present invention contemplates controlling the width of the nanostructures by either controlling the thickness of the conformal layer or the procedures of after fabrication modification.

The present invention contemplates further modification of shape and length of the nanostructure after fabrication with standard lithography method to remove unwanted parts.

Example 5

Nanostructure Fabrication by Combining Sidewall Image Transfer with Imprint Lithography Referring now to FIGS. 7 and 8, where other embodiments in accordance with the present invention whereby a method of fabricating controlled nanostructure is illustrated. FIG. 7a is a cross section view of the basic film stack. A sacrificial layer 9 has been deposited on top of an optional protection layer 8 on a substrate 7. The substrate is defined above, and the preferred embodiment is Si wafer. The optional protection layer 8 prevents unintended damage or removal of the substrate 7 and it can be formed by but not limited to either physical vapor deposition, chemical vapor deposition or direct growth by oxidation or nitrification of the substrate 7. The preferred material is silicon nitride or silicon oxide. The sacrificial layer 9 is a material that can be removed later by etching; the preferred material is polysilicon or a silicon oxide, preferably silicon dioxide. The sacrificial layer 9 can be patterned by standard lithography and etching, the pattern of which is shown in FIG. 7b. Examples of standard lithography are photolithography, electron beam lithography, ion-beam lithography, etc, preferably photolithography. Etching is achieved either in a plasma environment (dry etching) or in a solution environment (wet etching), preferably dry etching. A conformal layer 10 is then deposited on the fabricated pattern, as in FIG. 7c, followed by an anisotropic etch to remove all the conformal layer 10 except on the sidewall of sacrificial layer pattern 9, as depicted in FIG. 7d. The conformal layer 10 should have a different etching characteristics than the sacrificial layer 9 so that either material can be selectively removed while remove very little of the other, such material pairs comprise, but not limited to polysilicon and a silicon oxide, preferably silicon dioxide, polysilicon and silicon nitride, a silicon oxide, preferably silicon dioxide and silicon nitride, photoresist and polysilicon, alumina gallium arsenate and gallium arsenate, etc. The preferred material pair is polysilicon and a silicon oxide, preferably silicon dioxide.

Once the sacrificial layer 9 is exposed, it can be selectively removed by either dry or wet etching. FIG. 7e shows the remaining conformal layer structure 10 has approximately equal width to the film thickness, which can be less than 50 nm. This sublithographic images then can be transferred through the protective layer 8 into substrate 7 by etching or ion milling, as shown in FIG. 7f. After removing of protective layer 8, nanostructures with desired chemical composition ire fabricated in substrate 7.

The width of the nanostructure can be further reduced by either controlled etching or converting to a material that can be selectively removed. In one embodiment of the present invention, Si nanostructures can be further reduced in size by controlled $XeF_2$ etch. In one embodiment of the present invention, Si nanostructures can be further reduced in size by thermal oxidation to convert to $SiO_2$, which then can be removed by HF etching.

The position, length and shape of the nanostructures are determined by the initial pattern n the sacrificial layer 9, but can also be modified after fabrication, similar to the teaching related to FIG. 6. The nanostructures thus fabricated on the substrate 7 can be used as a mold to transfer the nanostructure pattern.

Example 6

Transfer of a Nanostructure Pattern

FIGS. 8a-8e illustrate the process of imprint lithography to transfer the pattern onto a substrate. FIG. 8a is a cross section view of a mold thus fabricated by the above method pressed against a substrate 12 coated with a resist 11. A thickness variation is created in the resist layer 11. Upon separation, an anisotropic etching process is used to transfer the pattern into entire resist, as shown in FIG. 8b. The desired composition of materials or layers of materials then can be deposited vertically onto the patterned substrate 12, preferably by evaporation or sputtering in vacuum environment, as shown in FIG. 8c. In the next step, the resist 11 is removed by dissolution in solvent, which left the deposited material 13 on the substrate 12, as shown in FIG. 8d. The deposited material 13 can also act as a mask to further transfer the nanostructure pattern into substrate 12, as depicted in FIG. 8e. The present invention contemplates controlling the shape of the nanostructures by controlling the shape of the pattern in the mold, which is further controlled in the mold fabrication process by the shape of the pattern in the sacrificial layer.

The present invention contemplates controlling the length of the nanostructures by controlling the length of the pattern in the mold, which is further controlled in the mold fabrication process by the length of the pattern in the sacrificial layer.

The present invention contemplates controlling the position of the nanostructures by controlling the position of the pattern in the mold, which is further controlled in the mold fabrication process by the position of the sacrificial layer.

Example 8

Nanostructure Sensing Devices

Shown in FIG. 9a-9g are examples of methods for the fabrication of nanoscale sensing devices by sidewall image transfer method. Referencing FIG. 9a-9g, (15) is the nanoscale thick semiconductor layer; (16) is a protective layer; (17) is a thin conformal layer; (18) is a resist; (19) is a contact. FIG. 9g shows an embodiment where the nanostructure is functionalized with a functionalizing agent, R.

FIG. 10a shows one embodiment of an array in accordance with the present invention. FIG. 10b shows a sensor device in accordance with one embodiment of the invention (23) is an insulator layer; (24) is a nanostructure sensing element comprising $TiO_2$, $SiO_2$, or the like and (25) is a contact or conductor.

Example 7

Nanostructure/Nanostructure Array Sensors: Nanostructures/Nanostructure Arrays and Contacts Fabricated in Parallel (at the Same Time)

The invention contemplates that nanostructure arrays and sensors made using the nanoarrays have contacts that are effectively in intimate contact and contiguous with the top semiconductor layer of the substrate, for example see FIG. 9d, (15). In this embodiment the top substrate layer, the contact and the nanostructure would all be of the same semiconductor material, preferably Si. Nanostructure array sensors in accordance with the present invention and possession the positional and compositional control may be fabricated in the following manner, with reference to FIG. 11. On top of a substrate (in this embodiment, the substrate (1) comprises a multilayer structure of a semiconductor/insulator/semiconductor), an insulating layer (2) may be deposited. A sacrificial layer (3) may then be deposited on top of this insulating layer. A photoresist may be spin-cast on top of the sacrificial layer, and a pattern will be generated in the photoresist via photolithography. The photoresist will serve as a mask to pattern the sacrificial layer through etching. Preferably the etch process is stopped at the insulating layer. The photoresist is then removed. A conformal layer (4) may be deposited over the patterned sacrificial layer. Referencing FIG. 12, the top of the conformal layer (4) may be removed by etching, thus exposing the top of the sacrificial layer pattern, (3). The sacrificial layer pattern will be selectively removed via etching, leaving conformal layer nanostructures. The conformal layer nanostructures will serve as a mask to etch into the top layer of the substrate. It is noted that after this step, FIG. 12 now omits the insulator layer 2. The conformal layer nanostructures will then be removed via etching, leaving behind nanostructures of the substrate material. Referencing FIG. 13, there is described another series of photolithography steps to fabricate photoresist structures on top of portions of the substrate material nanostructures. The exposed substrate material nanostructures will be etched away, followed by removal of the photoresist via etching. This creates a nanostructure having a shape of a half circle. This nanostructure is the top layer of the substrate that was started with. The nanostructure is made from the original top layer and everything but the nanostructure has been etched away.

Example 8

Forming a Sensor and Functionalization

Referencing FIG. 14, substrate is (1) which comprises a lower layer that may comprise a semiconductor, shown, but other materials are contemplated, an intermediate layer comprising an insulator and a top layer comprising a nanostructure, formed as in Example 7. The nanostructure is fitted with contacts by typical lithograpic techniques and functionalized. Nanostructures are created such that depending on the desired species detection, the surface of the substrate material nanostructures will be functionalized with the appropriate material.

Example 9

Nanostructure/Nanostructure Array Sensors: Nanostructures/Nanostructure Arrays and Contacts Fabricated in Series (at the Same Time)

Figure 15:
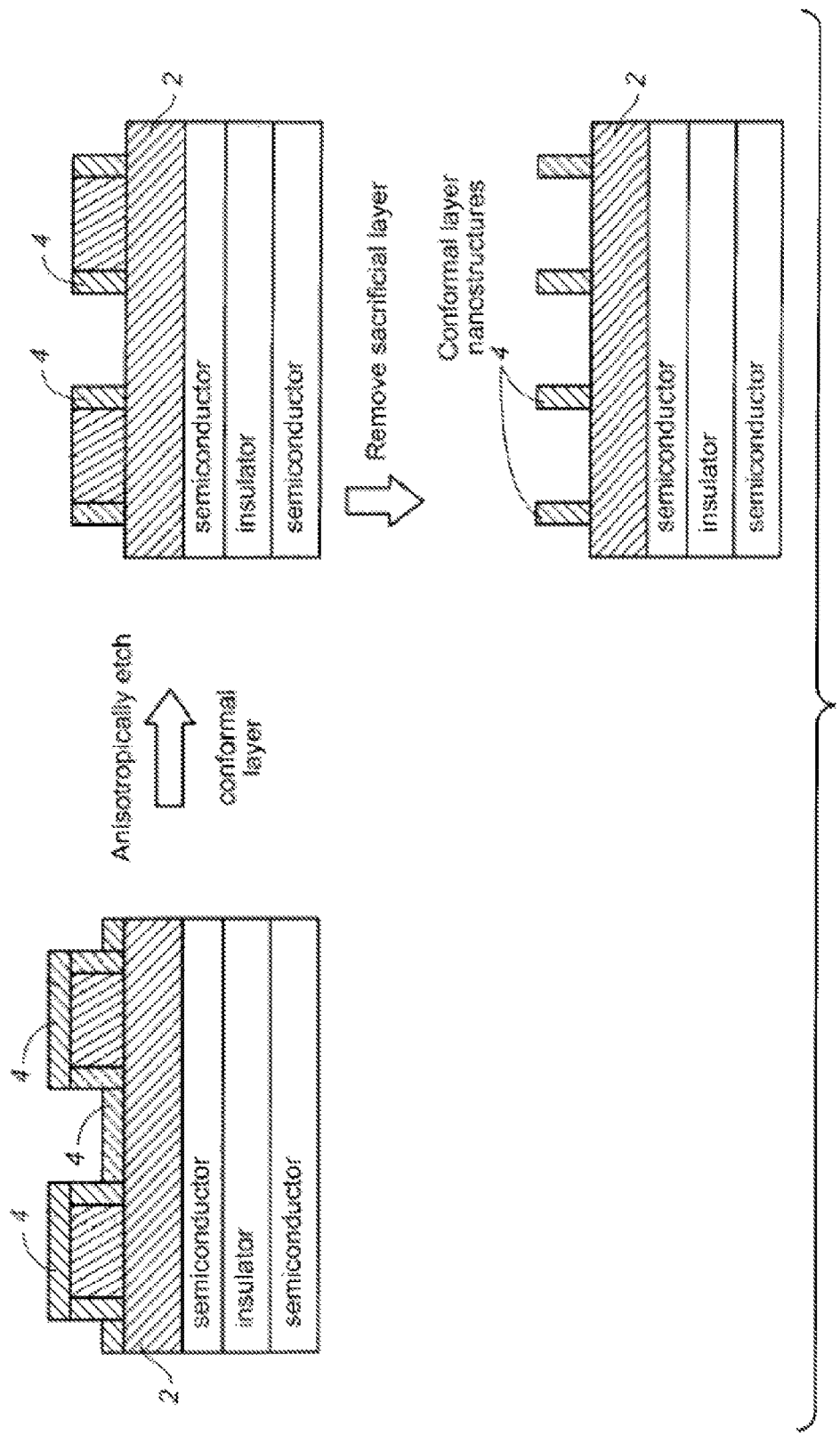
FIG. 15 is a method in accordance with one embodiment of the present invention.
Figure 16:
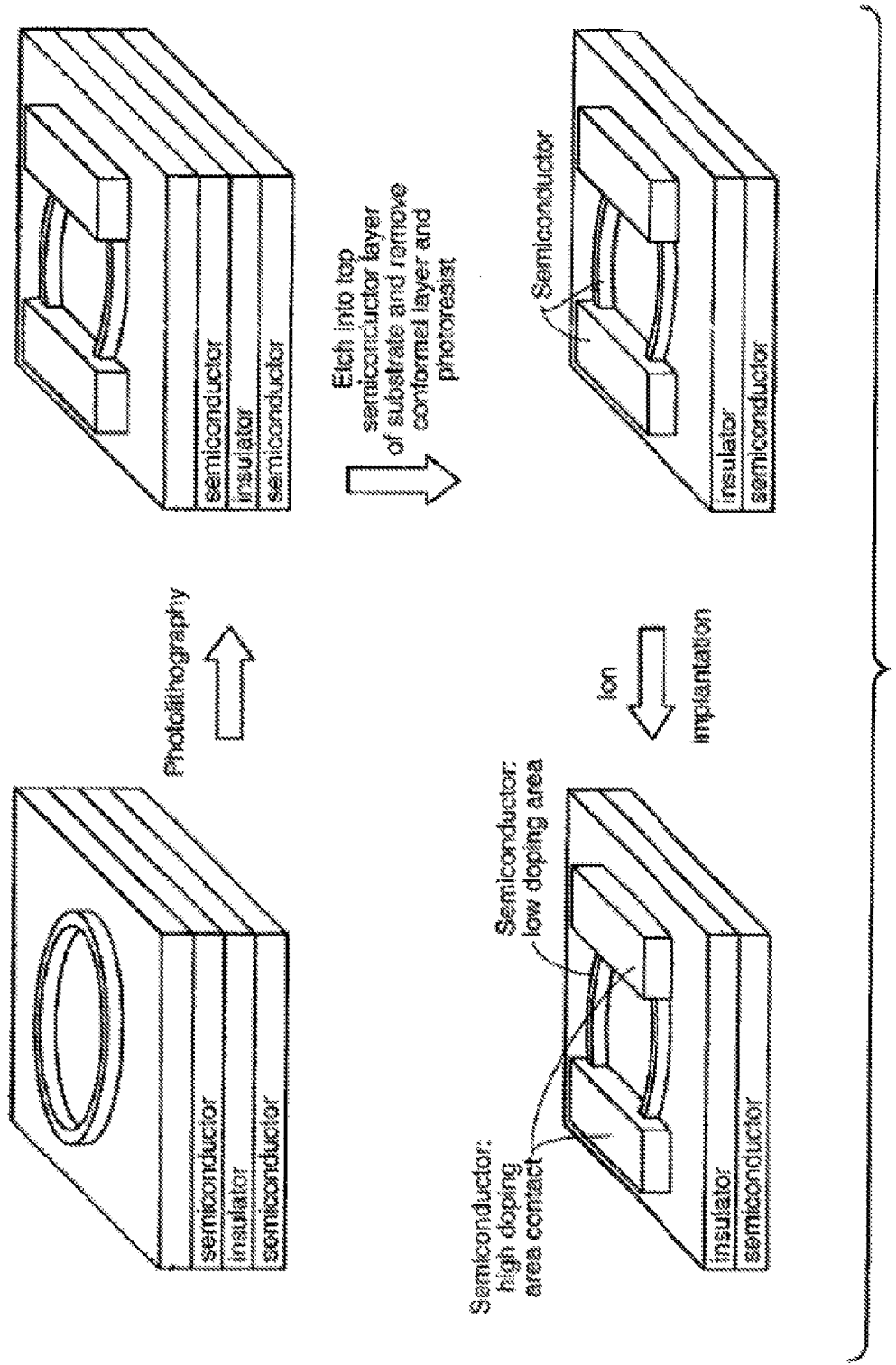
FIG. 16 is a method in accordance with one embodiment of the present invention.
Figure 17:
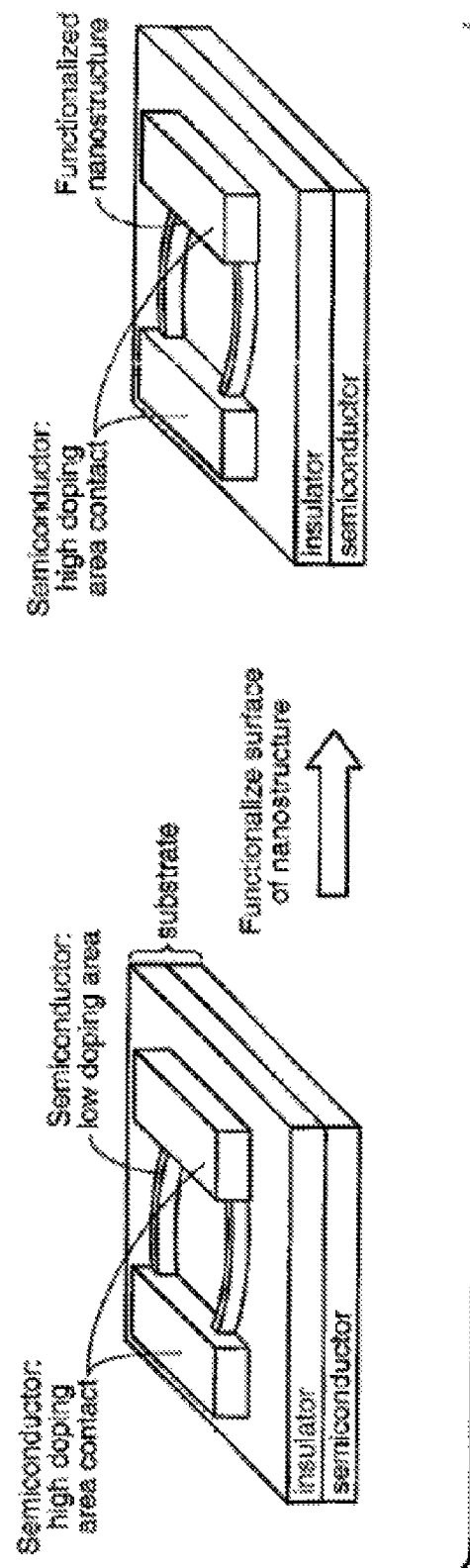
FIG. 17 is a method in accordance with one embodiment of the present invention.

The present invention contemplates that nanostructure arrays and sensors made using the arrays have contacts that effectively are positioned on top of the nanostructure, for example see FIG. 9f, (19). In this embodiment it is preferred that the top of the substrate be Si and the nanostructure and contact are of a different material. These nanostructure/nanostructure array sensors may be fabricated in the following manner. Conformal layer nanostructures are produced as recited in Example 7. These structures would be on top of the insulating layer (2), and are (4) in FIG. 15. Referencing FIG. 16, another series of photolithography steps may be performed to leave behind photoresist structures on top of portions of the conformal layer nanostructures. The photoresist structures and the conformal layer nanostructures will serve as masks to etch into the substrate. The photoresist and conformal layer nanostructures will then be removed via etching. This will produce substrate material nanostructures and substrate material contacts. Ion implantation will be utilized to create high doping areas for the contacts and low doping areas (the nanostructures) for the detection area. This enables the electron flow control between contacts. Depending on the desired species detection, the surface of the substrate material nanostructures will be functionalized with the appropriate material, FIG. 17.

Example 10

Nanoimprint Lithography for Nanostructure/Nanostructure Array Pattern Transfer In one embodiment of the present invention there is contemplated a nanostructure/nanostructure array pattern made by transferring to a different material via imprint lithography. The material chosen may vary depending on the intended use. First, the nanostructure/nanostructure array pattern may be generated as described in any of the above embodiments. This is intended to be used as the mold, FIGS. 18 and 19 (1: mold/mold material; 2:substrate; 3: imprint resist; 4: desired material depending on application). A new second substrate was then selected. An imprint resist was spin-casted onto the substrate is the imprint resist. The mold was then pressed into the resist layer of the second substrate at the necessary temperature and pressure. The mold was then separated from the resist layer. The residual resist of the second substrate was etched away to expose the substrate. The desired material was then deposited onto this second substrate, followed by lift-off of the imprint resist.

Example 11

Fabrication of a Suspended Nanostructure

A nanostructure may be created as described in Example 3, FIG. 5. The underlying optional insulator layer in the substrate or the substrate can be selectively removed by wet or dry etching at intended, predetermined positions or locations to create suspended nanostructures. Suspended Si nanostructures can be created by incorporating a $SiO_2$ layer in the substrate at the start of the fabrication process and removing the underlying $SiO_2$ layer at desired locations in solutions containing fluorinated agent after the Si nanostructure is fabricated by process shown in Example 3. The rest of the locations where $SiO_2$ is intended to keep are masked by lithography method, preferably photolithography. By patterning with lithography and exposing the area where $SiO_2$ is to be removed, and exposing the unmasked $SiO_2$ to HF to dissolve it, and removing the resist, the suspended nanostructure may be fabricated.

Although the foregoing invention has been described in some detail for purposes of clarity of understanding, those skilled in the art will appreciate that various adaptations and modifications of the just described preferred embodiments can be configured without departing from the scope and spirit of the invention. Moreover, the described processing distribution and classification engine features of the present invention may be implemented together or independently. Therefore, the described embodiments should be taken as illustrative and not restrictive, and the invention should not be limited to the details given herein but should be defined by the following claims and their full scope of equivalents.

What is claimed is:

1. A method of fabricating a nanostructure array comprising:
   providing a substrate having a top layer,
   depositing a sacrificial layer having a first etching characteristic directly on the top layer,
   patterning the sacrificial layer,
   forming a thin conformal layer having a second etching characteristic over the patterned sacrificial structure, wherein the first and second etching characteristics are different,
   anisotropically etching the conformal layer to create a pattern,
   removing the sacrificial layer,
   transferring the resulting conformal layer structure to the substrate by etching,
   removing any remaining conformal layer structure, and
   reducing the dimension of the nanostructure,
   thereby creating at least one nanostructure in the top layer.

2. The method of fabricating a nanostructure array of claim 1, wherein:
   the reduction in dimension is accomplished by controlled etching or converting to a material that has different etching characteristics and removing the material.

3. The method of fabricating a nanostructure array of claim 2, wherein:
   the nanostructure comprises Si, and
   the reduction in dimension is accomplished by thermal oxidation to convert to $SiO_2$, and
   contacting with an etchant to remove the oxide.

4. The method of fabricating a nanostructure array of claim 2, wherein:
   the nanostructure comprises Si,
   and the reduction in dimension is accomplished by controlled $XeF_2$ etch.

5. The method of fabricating a nanostructure array of claim 1,
   wherein:
   the substrate is a multilayer structure, comprising:
   a lower layer comprising silicon,
   an intermediate layer comprising an insulating material,
   an upper layer comprising a material chosen from the group consisting of semiconductors, metals and oxides, all of which may be doped or undoped.

6. The method of fabricating a nanostructure array of claim 5,
   wherein:
   the insulating material is chosen from the group consisting of nitrides, oxides and polymers.

7. The method of fabricating a nanostructure array of claim 5,
   wherein:
   the semiconductor is selected from the group consisting of group IV, III-V, II-VII semiconductors and semiconducting oxides, and it may be doped or undoped.

8. The method of fabricating a nanostructure array of claim 1,
   wherein:
   patterning the sacrificial layer is done by photolithography, electron beam lithography or ion beam lithography.

9. The method of fabricating a nanostructure array of claim 1, wherein: the conformal layer comprises silicon oxide, silicon nitride or polysilicon.

10. The method of fabricating a nanostructure array of claim 1, wherein:
    the conformal layer can be formed by chemical vapor deposition, spin coating, sputtering, evaporation or chemical reaction with the sacrificial layer.

11. The method of fabricating a nanostructure array of claim 1,
    wherein:
    the sacrificial layer is removed by either plasma or wet etching.

12. The method of fabricating a nanostructure array of claim 1, wherein:
    the substrate and the top layer comprise the same material, and are separated by an insulator layer.

13. The method of fabricating a nanostructure array of claim 1, wherein:
    the top layer comprises Si.

14. The method of fabricating a nanostructure array of claim 1, wherein:
    at least one nanostructure is fabricated on a predetermined location with positional control.

15. The method of fabricating a nanostructure array of claim 1, wherein:
    there are between 1000 and 1 billion nanostructures on the array, and are fabricated on a predetermined location and with positional control.

16. The method of fabricating a nanostructure array of claim 1, further
    comprising:
    functionalizing more than one nanostructure with a functionalizing agent.

17. The method of fabricating a nanostructure array of claim 16,
    wherein:
    the functionalizing agent is not the same for each nanostructure.

18. The method of fabricating a nanostructure array of claim 16,
    wherein more than one nanostructure is functionalized with one or more receptors selected from the group consisting of ss-DNAs, proteins, antibodies, platinum, photoactive molecules, photonic nanoparticle, inorganic ion, inorganic nanoparticle, magnetic ion, magnetic nanoparticle, electronic nanoparticle, metallic nanoparticle, metal oxide nanoparticle, gold nanoparticle, gold-coated nanoparticle, carbon nanotube, nanocrystal, quantum dot, protein domain, enzyme, hapten, antigen, biotin, digoxygenin, lectin, toxin, radioactive label, fluorophore, chromophore, or a chemiluminescent molecule.

19. The method of fabricating a nanostructure array of claim 1, wherein:
the nanostructure comprises the top layer of the substrate wherein in the top layer everything but the nanostructure has been etched away.

20. A method of fabricating a nanostructure array comprising:
providing a substrate having a top layer,
depositing a sacrificial layer having a first etching characteristic directly on the top layer,
patterning the sacrificial layer,
forming a thin conformal layer having a second etching characteristic over the patterned sacrificial structure, wherein the first and second etching characteristics are different,
anisotropically etching the conformal layer to create a pattern,
removing the sacrificial layer,
transferring the resulting conformal layer structure to the substrate by etching,
removing any remaining conformal layer structure, and
thereby creating at least one nanostructure in the top layer, wherein: the shape of at least one nanostructure is modified.

21. The method of fabricating a nanostructure array of claim 20, wherein:
at least part of the nanostructure is masked with resist, and any unmasked part is removed by etching.

22. The method of fabricating a nanostructure array of claim 21, wherein:
the resist is photoresist,
and is patterned by photolithography.

23. The method of fabricating a nanostructure array of claim 21, wherein:
the resist is electron beam resist or ion beam resist,
and is patterned by electron beam lithography or ion beam lithography.

24. A method of fabricating a nanostructure array comprising:
providing a substrate having a top layer,
depositing a sacrificial layer having a first etching characteristic directly on the top layer,
patterning the sacrificial layer,
forming a thin conformal layer having a second etching characteristic over the patterned sacrificial structure, wherein the first and second etching characteristics are different,
anisotropically etching the conformal layer to create a pattern,
removing the sacrificial layer,
transferring the resulting conformal layer structure to the substrate by etching,
removing any remaining conformal layer structure, and
forming a contact in intimate contact with at least one nanostructure,
thereby creating at least one nanostructure in the top layer.

25. The method of fabricating a nanostructure array of claim 24,
wherein:
the contact is formed by lithography.

26. The method of fabricating a nanostructure array of claim 25,
wherein:
the lithography is photolithography.

27. The method of fabricating a nanostructure array of claim 24,
wherein:
the contact is formed by forming a conducting film,
masking the contact area by lithography, and
etching any exposed film away.

28. A method of fabricating a nanostructure array comprising:
providing a substrate having a top layer,
depositing a sacrificial layer having a first etching characteristic directly on the top layer,
patterning the sacrificial layer,
forming a thin conformal layer having a second etching characteristic over the patterned sacrificial structure, wherein the first and second etching characteristics are different,
anisotropically etching the conformal layer to create a pattern,
removing the sacrificial layer,
transferring the resulting conformal layer structure to the substrate by etching,
removing any remaining conformal layer structure, and
functionalizing at least one nanostructure with a functionalizing agent,
thereby creating at least one nanostructure in the top layer.

29. A method of fabricating a nanostructure array comprising:
providing a substrate having a top layer,
depositing a sacrificial layer having a first etching characteristic directly on the top layer,
patterning the sacrificial layer,
forming a thin conformal layer having a second etching characteristic over the patterned sacrificial structure, wherein the first and second etching characteristics are different,
anisotropically etching the conformal layer to create a pattern,
removing the sacrificial layer,
transferring the resulting conformal layer structure to the substrate by etching, and
removing any remaining conformal layer structure,
thereby creating at least one nanostructure in the top layer, wherein
at least one contact positioned on a top layer of the substrate, and the contact, the nanostructure and the top layer comprise the same material.

30. The method of fabricating a nanostructure array of claim 29,
wherein:
there are a plurality of nanostructures, and
at least one contact is positioned in intimate contact with more than one nanostructure.

31. A method of fabricating a nanostructure array comprising:
providing a substrate having a top layer,
depositing a sacrificial layer having a first etching characteristic directly on the top layer,
patterning the sacrificial layer,
forming a thin conformal layer having a second etching characteristic over the patterned sacrificial structure, wherein the first and second etching characteristics are different,
anisotropically etching the conformal layer to create a pattern,
removing the sacrificial layer, transferring the resulting conformal layer structure to the substrate by etching, and
removing any remaining conformal layer structure,
thereby creating at least one nanostructure in the top layer,
wherein: the nanostructure comprises a material selected from the group consisting of $SnO_2$, $TiO_2$, Fe oxides, ZnO, $WO_3$, $Ga_2O_3$ and perovskites.

* * * * *